US010290997B2

(12) United States Patent
Mueller et al.

(10) Patent No.: US 10,290,997 B2
(45) Date of Patent: May 14, 2019

(54) METHOD OF PRODUCING AN ELECTRONIC COMPONENT

(71) Applicant: OSRAM Opto Semiconductors GmbH, Regensburg (DE)

(72) Inventors: Jens Mueller, Regensburg (DE); Christoph Stephan, Hemau (DE); Robert Walter, Parsberg (DE); Stefan Hartauer, Wolfsegg (DE); Christian Rumbolz, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/550,888

(22) PCT Filed: Feb. 18, 2016

(86) PCT No.: PCT/EP2016/053448
§ 371 (c)(1),
(2) Date: Aug. 14, 2017

(87) PCT Pub. No.: WO2016/131912
PCT Pub. Date: Aug. 25, 2016

(65) Prior Publication Data
US 2018/0048122 A1    Feb. 15, 2018

(30) Foreign Application Priority Data

Feb. 18, 2015    (DE) .................. 10 2015 102 300

(51) Int. Cl.
*H01S 5/20*    (2006.01)
*H01S 5/22*    (2006.01)
(Continued)

(52) U.S. Cl.
CPC .......... *H01S 5/2086* (2013.01); *H01S 5/0282* (2013.01); *H01S 5/0425* (2013.01);
(Continued)

(58) Field of Classification Search
None
See application file for complete search history.

(56) References Cited

U.S. PATENT DOCUMENTS 7,031,363 B2 *    4/2006    Biard ................. H01S 5/0425
372/45.01
8,143,148 B1    3/2012    Raring et al.
(Continued)

FOREIGN PATENT DOCUMENTS

JP    2016-127244    7/1916
JP    60-58692    4/1985
(Continued)

OTHER PUBLICATIONS

Notice of Reasons for Rejection dated Sep. 4, 2018, from counterpart JP Application No. 2017-540113 and its English Translation.

*Primary Examiner* — David E Graybill
(74) *Attorney, Agent, or Firm* — DLA Piper LLP (US)

(57) ABSTRACT

A method of producing an electronic component includes providing a surface comprising a first region and a second region adjoining the first region, arranging a sacrificial layer above the first region of the surface, arranging a passivation layer above the sacrificial layer and the second region of the surface, creating an opening in the passivation layer above the first region of the surface, wherein the opening in the passivation layer is created with an opening area that is smaller than the first region, and removing the sacrificial layer and the portions of the passivation layer that are arranged above the first region.

17 Claims, 16 Drawing Sheets

(51) Int. Cl.
*H01S 5/028* (2006.01)
*H01S 5/042* (2006.01)

(52) U.S. Cl.
CPC .............. *H01S 5/0422* (2013.01); *H01S 5/22* (2013.01); *H01S 2301/176* (2013.01)

(56) References Cited

U.S. PATENT DOCUMENTS

| | | | | |
|---|---|---|---|---|
| 8,728,842 | B2* | 5/2014 | Raring | H01S 5/34333 438/46 |
| 2002/0045356 | A1* | 4/2002 | Suzuki | H01L 21/02052 438/749 |
| 2003/0089997 | A1* | 5/2003 | Mergenthaler | H01L 23/585 257/774 |
| 2005/0092710 | A1 | 5/2005 | Biard et al. | |
| 2006/0172449 | A1* | 8/2006 | Lee | H01S 5/2231 438/46 |
| 2012/0178198 | A1* | 7/2012 | Raring | H01S 5/34333 438/46 |
| 2018/0048122 | A1* | 2/2018 | Mueller | H01S 5/0425 |

FOREIGN PATENT DOCUMENTS

| | | |
|---|---|---|
| JP | H04-367234 | 12/1992 |
| JP | 2000-058866 | 2/2000 |
| JP | 2000-114248 | 4/2000 |
| JP | 2000-183022 | 6/2000 |
| JP | 2004-289149 | 10/2004 |
| JP | 2005-210089 | 8/2005 |
| JP | 2006-186275 | 7/2006 |
| WO | 2015/116435 | 8/2015 |

* cited by examiner

METHOD OF PRODUCING AN ELECTRONIC COMPONENT

TECHNICAL FIELD

This disclosure relates to a method of producing an electronic component.

BACKGROUND

During production of electronic components, electrically insulating passivation layers are often applied and they are opened again during subsequent process steps at predetermined locations. Various methods are known for this purpose.

SUMMARY

We provide a method of producing an electronic component including providing a surface including a first region and a second region adjoining the first region, arranging a sacrificial layer above the first region of the surface, arranging a passivation layer above the sacrificial layer and the second region of the surface, creating an opening in the passivation layer above the first region of the surface, wherein the opening in the passivation layer is created with an opening area that is smaller than the first region, and removing the sacrificial layer and the portions of the passivation layer that are arranged above the first region.

LIST OF REFERENCE SIGNS

Figure 1:
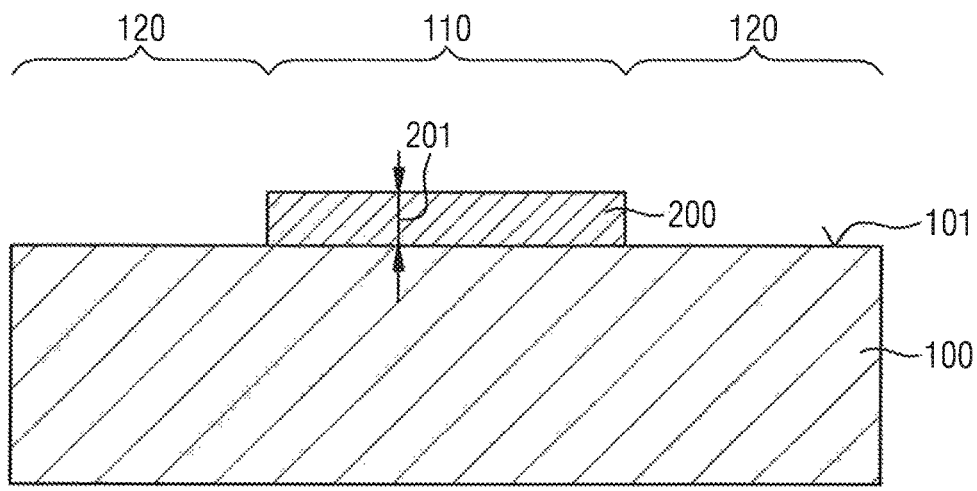
FIG. 1 schematically shows a sectional side view of a semiconductor body with a sacrificial layer arranged above a first region of its surface.

| Electronic component | 10 |
| --- | --- |
| Semiconductor body | 100 |
| Surface | 101 |
| First region | 110 |
| Waveguide structure | 115 |
| Second region | 120 |
| Removed part | 125 |
| Third region | 130 |
| Supporting structure | 140 |
| Sacrificial layer | 200 |
| Thickness | 201 |
| Exposed portion of the sacrificial layer | 210 |
| Laterally dissolved part of the sacrificial layer | 220 |
| Passivation layer | 300 |
| Thickness | 301 |
| Exposed portion of the passivation layer | 310 |
| Opening in the passivation layer | 311 |
| Opening area | 312 |
| Collar | 320 |
| Photoresist layer | 400 |
| Opening in the photoresist layer | 410 |
| Electrically conductive layer | 500 |
| Cover layer | 600 |
| Opening in the cover layer | 610 |

DETAILED DESCRIPTION

Our method of producing an electronic component comprises steps of providing a surface comprising a first region and a second region adjoining the first region, arranging a sacrificial layer above the first region of the surface, arranging a passivation layer above the sacrificial layer and the second region of the surface, creating an opening in the passivation layer above the first region of the surface, and removing the sacrificial layer and the portions of the passivation layer that are arranged above the first region.

This method affords the advantage that the opening in the passivation layer need not be centered or aligned with high accuracy with respect to the first region of the surface. As a result, the method is implementable simply, cost-effectively and rapidly. The low accuracy required in the positioning of the opening in the passivation layer is made possible by the fact that the exact position of the first region of the surface is defined by the position of the sacrificial layer, rather than by the position of the opening in the passivation layer. Through the opening in the passivation layer it is merely necessary to provide an access to the sacrificial layer to be able to remove the sacrificial layer.

The passivation layer is created with an opening area smaller than the first region. This advantageously makes it possible to ensure in a simple manner that the opening in the passivation layer is arranged completely above the first region of the surface, even if the positioning of the opening in the passivation layer is carried out with comparatively low accuracy.

Creating the opening in the passivation layer may comprise steps of arranging a photoresist layer above the passivation layer, creating an opening in the photoresist layer above the first region of the surface, and removing a part of the passivation layer that is arranged below the opening in the photoresist layer. In this case, the method additionally comprises a further step of removing the photoresist. Since creating the opening in the passivation layer need not be carried out with very high accuracy during the positioning of the opening in the passivation layer, the opening in the photoresist layer may also be created with not very high accuracy during positioning. This advantageously makes it possible to implement the method in a simple, rapid and cost-effective manner.

Before arranging the sacrificial layer, an electrically conductive layer may be arranged above the first region of the surface or above the first region and the second region of the surface. The electrically conductive layer may serve, for example, as an electrical contact by electrical contacting a component part of the electronic component obtainable by the method. The electrically conductive layer is advantageously made accessible through the opening in the passivation layer created above the first region of the surface by the method.

Before arranging the passivation layer, a part of the surface may be removed in the second region. As a result, a region of the surface that is elevated above the second region of the surface may remain in the first region of the surface.

The surface may be a surface of a semiconductor body. In this case, the semiconductor body may comprise, for example, integrated optoelectronic circuits or component parts.

A waveguide structure of a laser component may be formed in the first region of the surface. The method advantageously makes it possible to arrange the passivation layer and the opening in the passivation layer with high accuracy above the waveguide structure of the laser component such that sidewalls of the waveguide structure of the laser component are covered by the passivation layer and the opening in the passivation layer is arranged above the top side of the waveguide structure of the laser component, as a result of which an electrical contacting of the laser component is made possible. In this case, the method results in a precise alignment of the passivation layer and the opening in the passivation layer with respect to the waveguide structure of the laser component even though the opening in the passivation layer initially need only be aligned with not very high accuracy with respect to the first region of the surface.

Before arranging the passivation layer, a cover layer may be arranged above the sacrificial layer. In this case, after creating the opening in the passivation layer, a part of the cover layer arranged below the opening in the passivation layer is also removed. The cover layer may advantageously perform further tasks during production of the electronic component. By way of example, the cover layer may serve as an etching mask during production of the electronic component. Moreover, the cover layer may facilitate creating the opening in the passivation layer, without damaging in the process an electrically conductive layer possibly arranged on the surface.

Before arranging the passivation layer, a part of the sacrificial layer may be removed. In this case, by way of example, a part of the sacrificial layer arranged below the cover layer may be dissolved. The free space produced as a result of dissolving the part of the sacrificial layer may then advantageously be filled by the passivation layer. As a result, the passivation layer may form a circumferential collar on the top side of a layer arranged below the sacrificial layer, for example, on the top side of an electrically conductive layer arranged below the sacrificial layer.

The cover layer may be created from a material comprising $SiO_2$, SiN, TiWN, a photoresist or a metal. Advantageously, these materials have proved to be suitable.

The sacrificial layer may also be arranged above a third region in the surface, the third region being spaced apart from the first region. In this case, the passivation layer is also arranged above the third region in the surface. However, above the third region of the surface no opening is created in the passivation layer. This makes it possible to form an elevated structure above the third region of the surface, the third region being spaced apart from the first region, the elevated structure being covered by the passivation layer. In the electronic component obtainable by the method, the elevated structure may serve, for example, as a mechanical supporting structure and/or as a mechanical stop to protect a component part of the electronic component obtainable by the method, the component part being formed in the first region of the surface.

The sacrificial layer may be created from a material comprising ZnO, $Al_2O_3$, TiWN, SiO or a photoresist. Advantageously, we found that a sacrificial layer comprising such a material is stable relative to dry etching processes usable for creating the opening in the passivation layer and at the same time is readily etchable by wet-chemical etching processes, which enables a simple removal of the sacrificial layer.

The sacrificial layer may be created with a thickness of 10 nm to 1 µm, preferably with a thickness of 50 nm to 500 nm. This advantageously makes it possible to reliably cover the sacrificial layer with the passivation layer. At the same time, such a thickness of the sacrificial layer makes it possible to reliably remove the sacrificial layer during the method.

The passivation layer may be created by a vapor deposition method, in particular by chemical vapor deposition or atomic layer deposition. These methods advantageously make it possible to create the passivation layer with good overmolding, as a result of which a reliable covering of deeper layers by the passivation layer is achieved.

The passivation layer may be created from a material comprising SiN, SiO, TaO, ZrO, AlO or ITO. In this case, ITO denotes indium tin oxide. Advantageously, such materials afford a good overmolding, in particular a good overmolding of vertical or oblique surfaces, during their deposition. Moreover, a passivation layer comprising such a material can be etched well by dry-chemical etching processes and at the same time is stable relative to wet-chemical etching processes such as may be used to remove the sacrificial layer. Moreover, a passivation layer comprising such materials offers a good electrical insulation and a low optical absorption.

The passivation layer may be created with a thickness of 1 nm to 10 µm, preferably with a thickness of 10 nm to 2 µm. Advantageously, passivation layers of this thickness have proved to be expedient.

Removing part of the passivation layer may be carried out by dry-chemical etching, in particular using fluorine, chlorine or argon. Advantageously, such an etching method enables a simple etching of the passivation layer, wherein the sacrificial layer is attacked only to a small extent.

Removing the sacrificial layer may be carried out by wet-chemical etching, in particular using HCl or KOH. Advantageously, such an etching method enables a reliable etching of the sacrificial layer, wherein the passivation layer is attacked only to a small extent.

The above-described properties, features and advantages and the way in which they are achieved will become clearer and more clearly understood in association with the following description of the examples which are explained in greater detail in association with the drawings.

FIG. 1 shows a schematic sectional side view of a semiconductor body 100. The semiconductor body 100 may be configured for example as a wafer and may comprise, for example, a layer sequence of different semiconductor materials and/or integrated electronic component parts or circuits. The semiconductor body 100 may be provided, for example, to produce optoelectronic components, in particular, for example, laser components.

The semiconductor body 100 comprises a surface 101. The surface 101 of the semiconductor body 100 comprises a first region 110 and a second region 120 adjoining the first region 110. In the example illustrated schematically in FIG. 1, the first region 110 of the surface 101 is configured in an insular fashion and enclosed by the second region 120. However, the first region 110 may, for example, also be configured in a strip-shaped fashion and be delimited by the second region 120 on both sides.

A sacrificial layer 200 has been arranged above the first region 110 of the surface 101 of the semiconductor body 100. In this case, the sacrificial layer 200 covers the entire first region 110 of the surface 101, but not the second region 120. As a result, the sacrificial layer 200 defines the first region 110. The first region 110 of the surface 101 is that region of the surface 101 of the semiconductor body 100 which is covered by the sacrificial layer 200.

The sacrificial layer 200 comprises a material which may be dissolved in a later processing step by a wet-chemical etching method. The sacrificial layer 200 may comprise, for example, a material comprising ZnO, $Al_2O_3$, TiWN, SiO or a photoresist. However, other materials are also possible. The sacrificial layer 200 may have been applied on the first region 110 of the surface 101 of the semiconductor body 100, for example, by a photolithographic method or by means of a shadow mask. The sacrificial layer 200 comprises a thickness 201 measured perpendicularly to the surface 101 of the semiconductor body 100. The thickness 201 may be, for example, 10 nm to 1 µm, in particular, for example, 50 nm to 500 nm.

Figure 2:
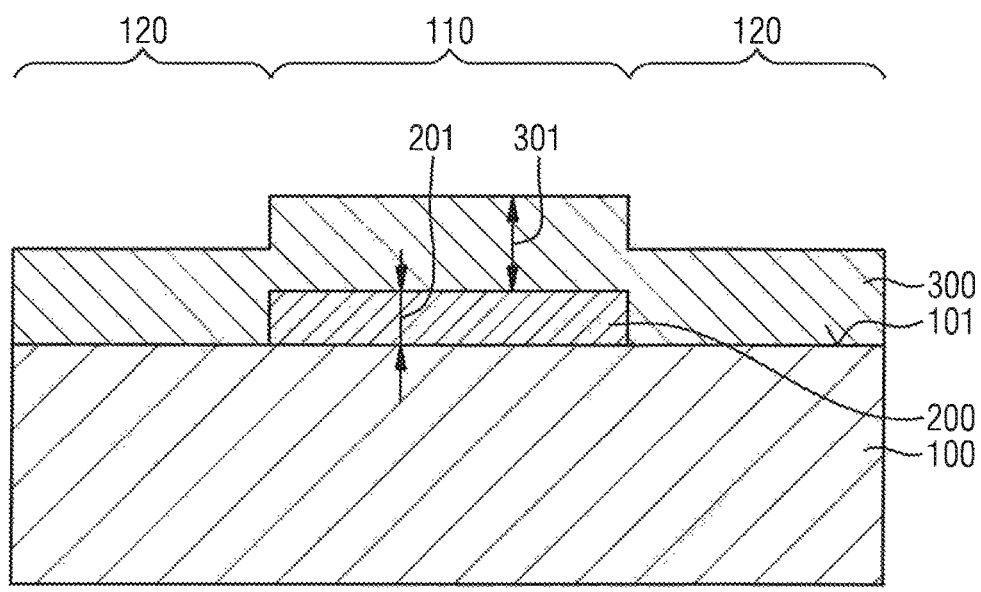
FIG. 2 schematically shows the semiconductor body with a passivation layer arranged above the sacrificial layer and a second region of the surface.

FIG. 2 shows a schematic sectional side view of the semiconductor body 100 in a processing state temporally succeeding the illustration in FIG. 1.

A passivation layer 300 has been arranged above the sacrificial layer 200 and above the second region 120 of the surface 101 of the semiconductor body 100. The passivation layer 300 completely covers the sacrificial layer 200 and the second region 120 of the surface 101 and also covers the step formed at the edge of the sacrificial layer 200. For this purpose, the passivation layer 300 was applied by a deposition method exhibiting good overmolding, for example, by vapor deposition, in particular, for example, by chemical vapor deposition or by atomic layer deposition.

The passivation layer 300 comprises an electrically insulating material. If the semiconductor body 100 is provided to produce an optoelectronic component, the material of the passivation layer 300 may be chosen such that it comprises a low optical absorption. Moreover, the material of the passivation layer 300 is chosen such that it may be dissolved well in a subsequent processing step by a dry-chemical etching method, but is stable relative to a wet-chemical etching method used for dissolving the sacrificial layer 200.

The passivation layer may comprise, for example, a material comprising SiN, SiO, TaO, ZrO, AlO or ITO (indium tin oxide).

The passivation layer 300 comprises a thickness 301 measured perpendicularly to the surface 101 of the semiconductor body 100. The thickness 301 may be, for example, 1 nm to 10 µm, in particular, for example, 10 nm to 2 µm. It is expedient if the thickness 301 of the passivation layer 300 does not exceed ten times the thickness 201 of the sacrificial layer 200.

Figure 3:
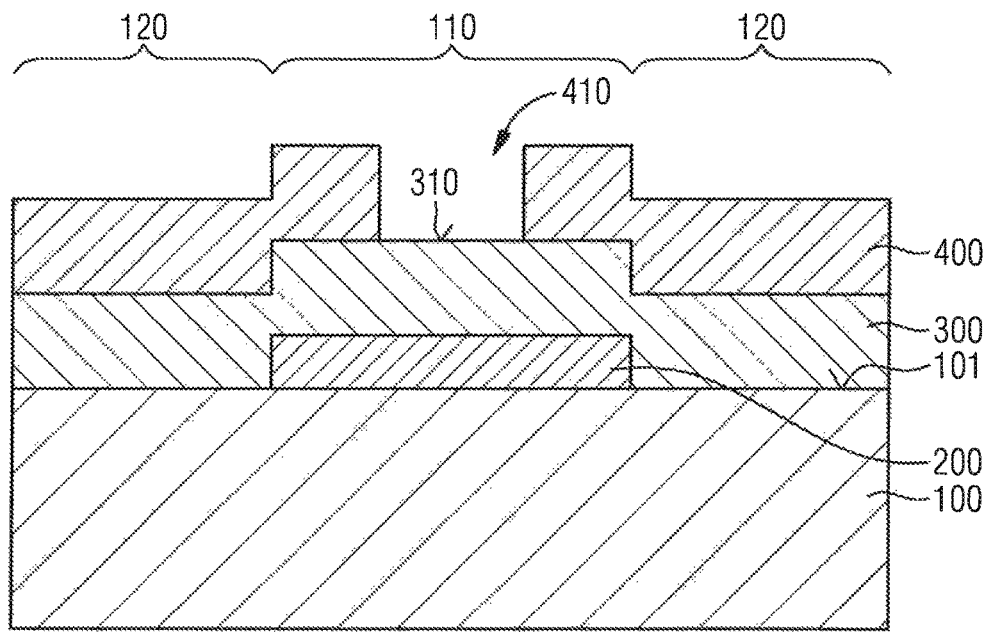
FIG. 3 schematically shows the semiconductor body with a photoresist layer arranged above the passivation layer, the photoresist layer comprising an opening above the first region.

FIG. 3 shows a schematic sectional side view of the semiconductor body 100 in a processing state temporally succeeding the illustration in FIG. 2.

A photoresist layer 400 has been arranged above the passivation layer 300. Afterward, an opening 410 in the photoresist layer 400 has been created above the first region 110 of the surface 101 of the semiconductor body 100. A portion 310 of the passivation layer 300 is exposed in the opening 410 in the photoresist layer 400.

The opening 410 created in the photoresist layer 400 comprises an opening area that is smaller than the area of the first region 110 of the surface 101 of the semiconductor body 100. The opening 410 arranged in the photoresist layer 400 is arranged above the first region 110 of the surface 101 of the semiconductor body 100, but need not be aligned with respect to the boundaries of the first region 110 or be centered above the center of the first region 110. By way of example, an edge of the opening 410 of the photoresist layer 400 may be spaced apart approximately 10 µm from the edge of the first region 110 of the surface 101 of the semiconductor body 100 in a direction parallel to the surface 101 of the semiconductor body 100. This makes it possible to create the opening 410 in the photoresist layer 400 by a method which is implementable simply, rapidly and cost-effectively and which is associated with a comparatively large alignment tolerance.

Figure 4:
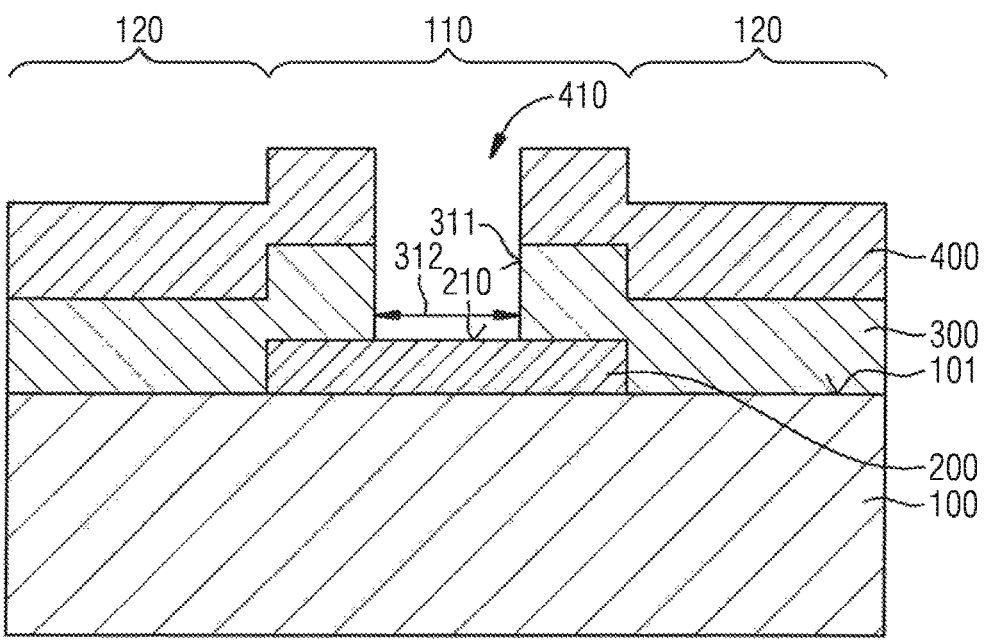
FIG. 4 schematically shows the semiconductor body with an opening created in the passivation layer.

FIG. 4 shows a schematic sectional side view of the semiconductor body 100 in a processing state temporally succeeding the illustration in FIG. 3.

An opening 311 in the passivation layer 300 has been created above the first region 110 of the surface 101 of the semiconductor body 100. For this purpose, the portion 310 of the passivation layer 300 exposed in the opening 410 of the photoresist layer 400 has been removed through the opening 410 of the photoresist layer 400. In this case, a portion 210 of the sacrificial layer 200 was exposed at the bottom of the opening 311 in the passivation layer 300.

Creating the opening 311 in the passivation layer 300 was carried out by dry-chemical etching, in particular using fluorine, chlorine or argon. In this case, the parts of the passivation layer 300 that were not exposed in the opening 410 in the photoresist layer 400 were protected against etching by the photoresist layer 400. The dry-chemical etching was carried out such that the sacrificial layer 200 has substantially not been attacked. Preferably, the sacrificial layer 200 comprises a material that is more etching-stable relative to the dry-chemical etching method than the material of the passivation layer 300.

The opening 311 created in the passivation layer 300 comprises an opening area 312 which may correspond approximately to the opening area of the opening 410 in the photoresist layer 400 and is thus smaller than the area of the first region 110 of the surface 101 of the semiconductor body 100 and thus also smaller than the area of the sacrificial layer 200.

In the method steps explained with reference to FIGS. 3 and 4, the photoresist layer 400 with the opening 410 arranged in the photoresist layer 400 was used as an etching mask to create the opening 311 in the passivation layer 300. It is alternatively possible to dispense with the photoresist layer 400 and create the opening 311 in the passivation layer 300 using a shadow mask. This is made possible by the fact that the opening area 312 of the opening 311 to be created in the passivation layer 300 is smaller than the area of the first region 110 of the surface 101 of the semiconductor body 100 and need not be precisely aligned either with respect to the edges or with respect to the center of the first region 110 of the surface 101 of the semiconductor body 100.

Figure 5:
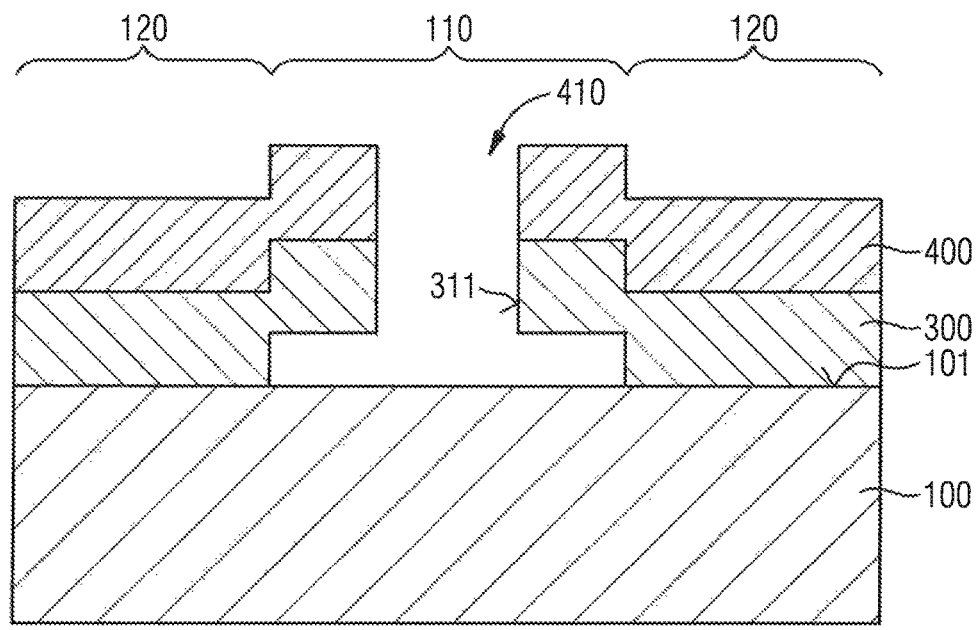
FIG. 5 schematically shows the semiconductor body after the process of dissolving the sacrificial layer.

FIG. 5 shows a schematic sectional side view of the semiconductor body 100 in a processing state temporally succeeding the illustration in FIG. 4.

The sacrificial layer 200 accessible through the opening 410 in the photoresist layer 400 and the opening 311 in the passivation layer 300 has been removed by wet-chemical etching. By way of example, HCl or KOH may have been used in the wet-chemical etching. The semiconductor body 100 and the passivation layer 300 have not been attacked, or have been attacked only to a very small extent, by the wet-chemical etching.

Since the opening area 312 of the opening 311 in the passivation layer 300 is smaller than the area of the first region 110 and of the sacrificial layer 200, the passivation layer 300 has been partly undercut during the process of dissolving the sacrificial layer 200. The portions of the passivation layer 300 arranged above the first region 110 of the surface 101 of the semiconductor body 100 are self-supporting after the process of dissolving the sacrificial layer 200 and only in the transition region between the first region 110 and the second region 120 of the surface 101 of the semiconductor body 100 are said portions connected to the portions of the passivation layer 300 fixedly connected to the surface 101 of the semiconductor body 100 in the second region 120. In a subsequent method step, the transition region forms a predetermined breaking location at which the self-supporting parts of the passivation layer 300 break off.

Figure 6:
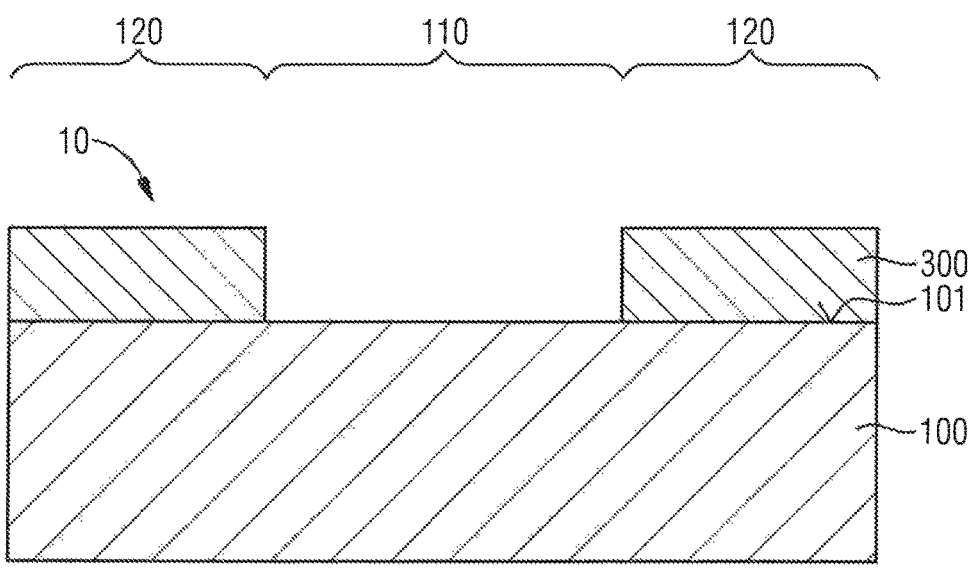
FIG. 6 schematically shows a sectional side view of an electronic component produced from the semiconductor body after the process of removing the photoresist layer.

FIG. 6 shows a schematic sectional side view of the semiconductor body 100 in a processing state temporally succeeding the illustration in FIG. 5. As a result of the further processing, an electronic component 10 has been formed from the semiconductor body 100, but the electronic component may still be unfinished in the processing state illustrated in FIG. 6.

The photoresist layer 400 has been removed. In this case or during a further method step, a mechanical loading has been exerted on the semiconductor body 100, as a result of which mechanical loading the self-supporting portions of the passivation layer 300 arranged above the first region 110 of the surface 101 of the semiconductor body 100 have been broken off at the above-described predetermined breaking locations and have thereby been removed. As a result, in the electronic component 10 in the processing state illustrated in FIG. 6, the surface 101 of the semiconductor body 100 is completely exposed in the first region 110, while it is completely covered by the passivation layer 300 in the second region 120.

The surface 101 of the semiconductor body 100 exposed in the first region 110 may serve, for example, to electrically contact the electronic component 10. For this purpose, by way of example, in a subsequent processing step, an electrically conductive layer may be arranged in the first region 110 on the surface 101 of the semiconductor body 100.

A number of variants of the method explained with reference to FIGS. 1 to 6 are described below. In this case, substantially only the deviations from the method in accordance with FIGS. 1 to 6 are explained. For the rest, the methods described below correspond to the method in accordance with FIGS. 1 to 6, in particular with regard to the processes and materials used. For corresponding component parts, the same reference signs as in FIGS. 1 to 6 are used in the figures described below. Furthermore, the features of the below-described variants of the method in accordance with FIGS. 1 to 6 may also be combined with one another arbitrarily, provided that this is not precluded by logically conclusive incompatibilities.

Figure 7:
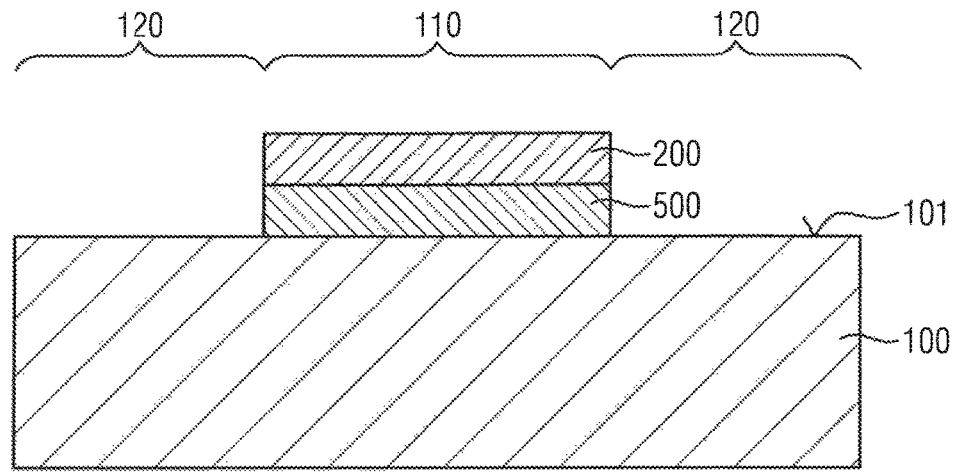
FIG. 7 schematically shows a sectional side view of a semiconductor body with an electrically conductive layer arranged above a first region of its surface, and with a sacrificial layer arranged thereabove.

FIG. 7 shows a schematic sectional side view of the semiconductor body 100 comprising the surface 101 comprising the first region 110 and the second region 120, in accordance with one variant of the method. An electrically conductive layer 500 is arranged above the first region 110 of the surface 101. The sacrificial layer 200 is arranged above the electrically conductive layer 500. The electrically conductive layer 500 and the sacrificial layer 200 are each delimited to the first region 110 of the surface 101 and thereby define the first region 110. However, the electrically conductive layer 500 might also be formed in a manner narrower or wider than the sacrificial layer 200 and the first region 110. The electrically conductive layer 500 and the sacrificial layer 200 may have been structured jointly or separately from one another.

The electrically conductive layer 500 may comprise, for example, a metal, for example, Ti, Pt, Au, Pd, Ni, ITO, Al, Ag, Zn or Cr. The electrically conductive layer 500 may also comprise a plurality of metal layers. The electrically conductive layer 500 may also comprise some other electrically conductive material.

The electrically conductive layer 500 and the sacrificial layer 200 may jointly comprise a thickness of 10 nm to 100 µm, in particular, for example, 100 nm to 5 µm.

Figure 8:
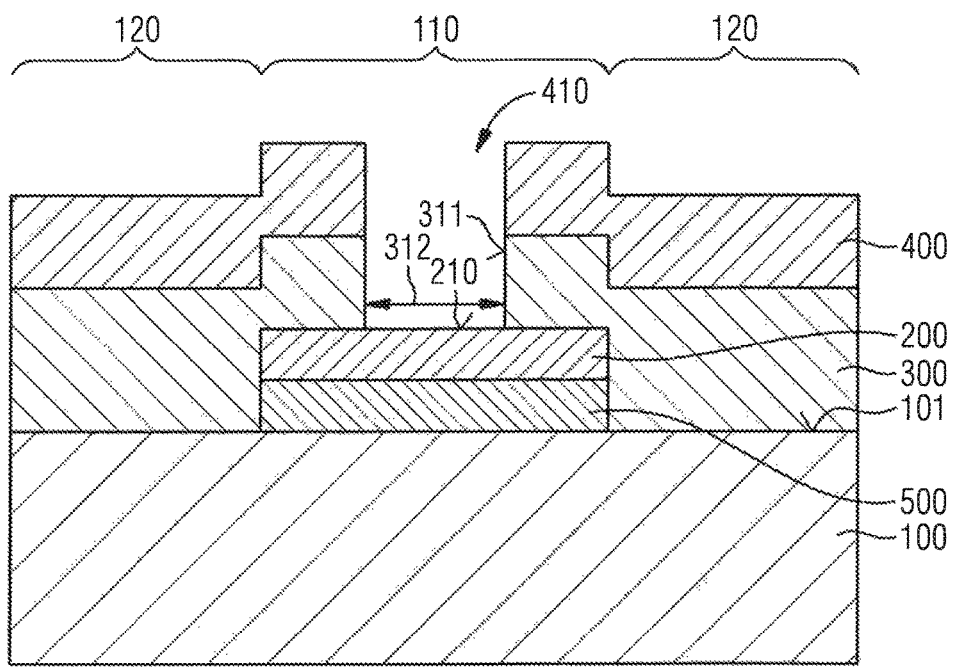
FIG. 8 schematically shows the semiconductor body after the process of applying a passivation layer and a photoresist layer and the process of creating openings in the photoresist layer and the passivation layer.

FIG. 8 shows a schematic sectional side view of the semiconductor body 100 in a processing state temporally succeeding the illustration in FIG. 7.

The passivation layer 300 and the photoresist layer 400 have been arranged above the sacrificial layer 200 and above the second region 120 of the surface 101 of the semiconductor body 100. Afterward, the opening 410 has been created in the photoresist layer 400 and the opening 311 has been created in the passivation layer 300 such that the portion 210 of the sacrificial layer 200 is then exposed in the opening 311 of the passivation layer 300.

Figure 9:
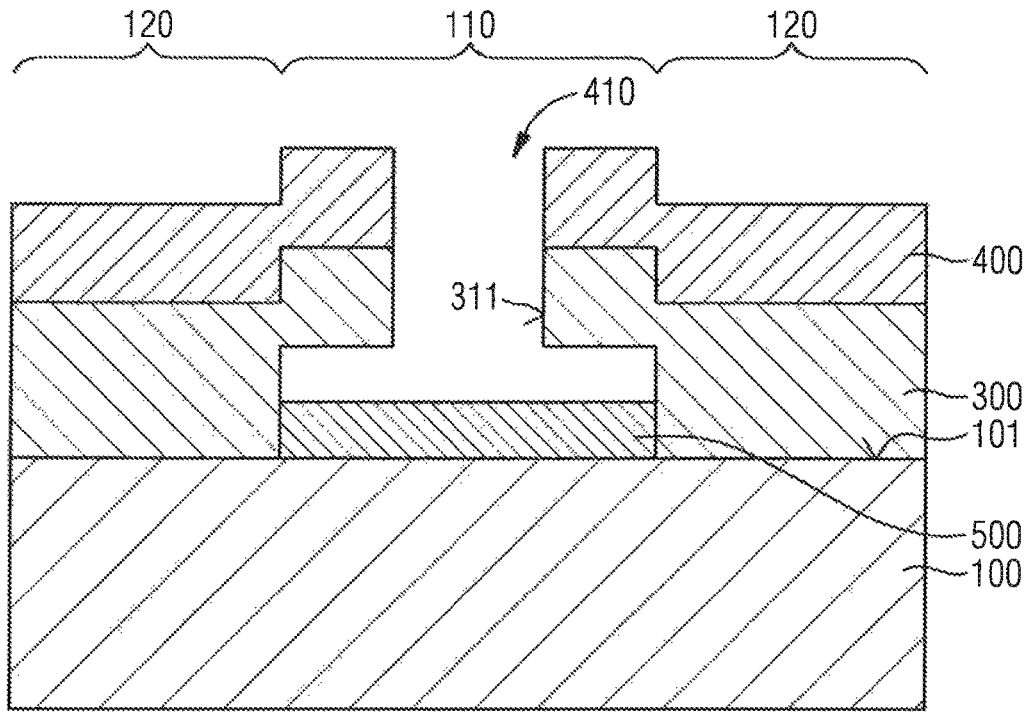
FIG. 9 schematically shows the semiconductor body after the process of dissolving the sacrificial layer.

FIG. 9 shows a schematic sectional side view of the semiconductor body 100 in a processing state temporally succeeding the illustration in FIG. 8.

The sacrificial layer 200 has been dissolved through the opening 410 in the photoresist layer 400 and the opening 311 in the passivation layer 300. In this case, the electrically conductive layer 500 has remained above the first region 110 of the surface 101 of the semiconductor body 100.

Figure 10:
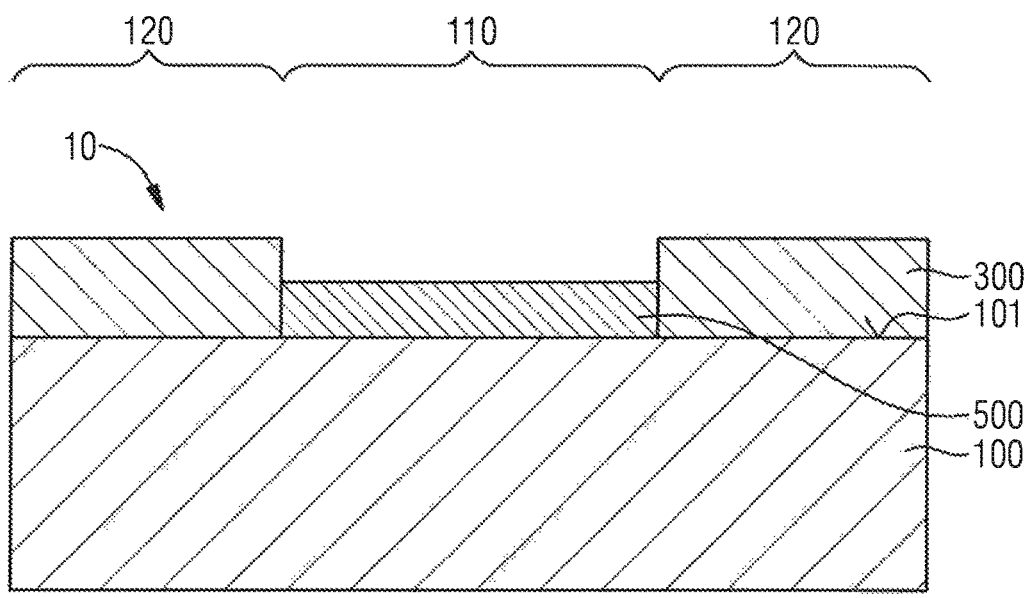
FIG. 10 schematically shows a sectional side view of a part of an electronic component formed from the semiconductor body after the process of stripping away the photoresist layer.

FIG. 10 shows a schematic sectional side view of the semiconductor body 100 in a processing state temporally succeeding the illustration in FIG. 9. The electronic component 10 has been formed from the semiconductor body 100, which electronic component may still be unfinished in the processing state illustrated in FIG. 10.

The photoresist layer 400 has been removed from the top side of the passivation layer 300. In this case or during a further processing step, the parts of the passivation layer 300 projecting beyond the first region 110 of the surface 101 of the semiconductor body 100 have been removed. As a result, the electrically conductive layer 500 is then exposed above the first region 110 of the surface 101 of the semiconductor body 100. The second region 120 of the surface 101 of the semiconductor body 100 is covered by the passivation layer 300, which precisely adjoins the electrically conductive layer 500 arranged above the first region 110.

In the electronic component 10, the electrically conductive layer 500 may serve, for example, for electrical contacting.

Figure 11:
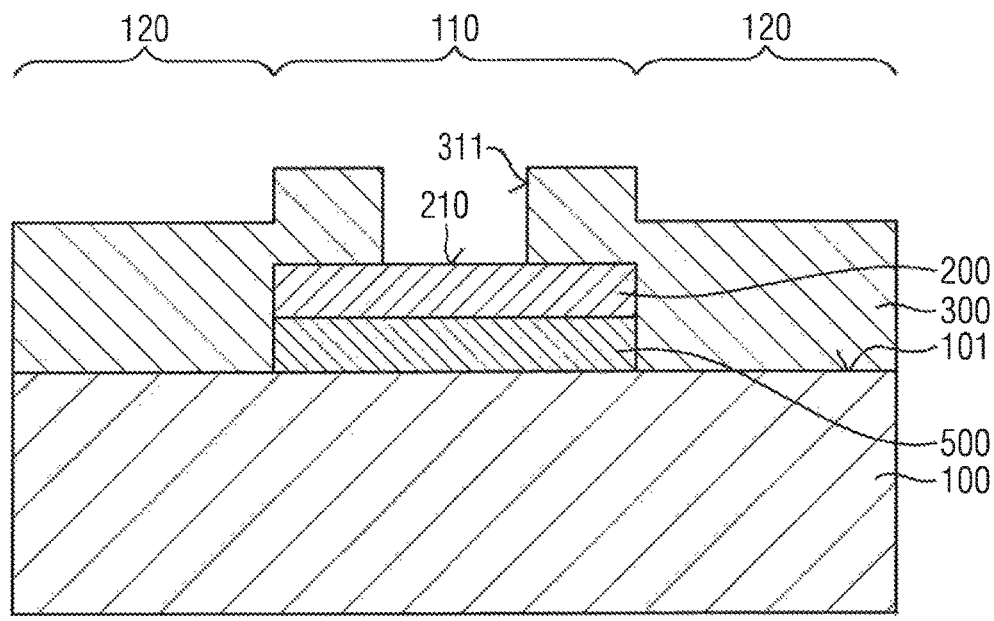
FIG. 11 schematically shows a sectional side view of a semiconductor body with a passivation layer arranged above a sacrificial layer after the process of removing a photoresist layer, but before the process of dissolving a sacrificial layer.

FIG. 11 shows a schematic sectional side view of the semiconductor body 100 in a processing state temporally succeeding the illustration in FIG. 8, in accordance with an alternative procedure.

In the processing state illustrated in FIG. 11, the photoresist layer 400 has been removed from the top side of the passivation layer 300 before the process of dissolving the sacrificial layer 200. In a processing step temporally succeeding the illustration in FIG. 11, the sacrificial layer 200 may then be dissolved through the opening 311 in the passivation layer 300. In this case or during a further processing step, a mechanical loading is exerted on the semiconductor body 100 and the passivation layer 300, as a result of which the portions of the passivation layer 300 projecting beyond the first region 110 of the surface 101 of the semiconductor body 100 are removed. The result of this processing corresponds to the processing state shown in FIG. 10.

Figure 12:
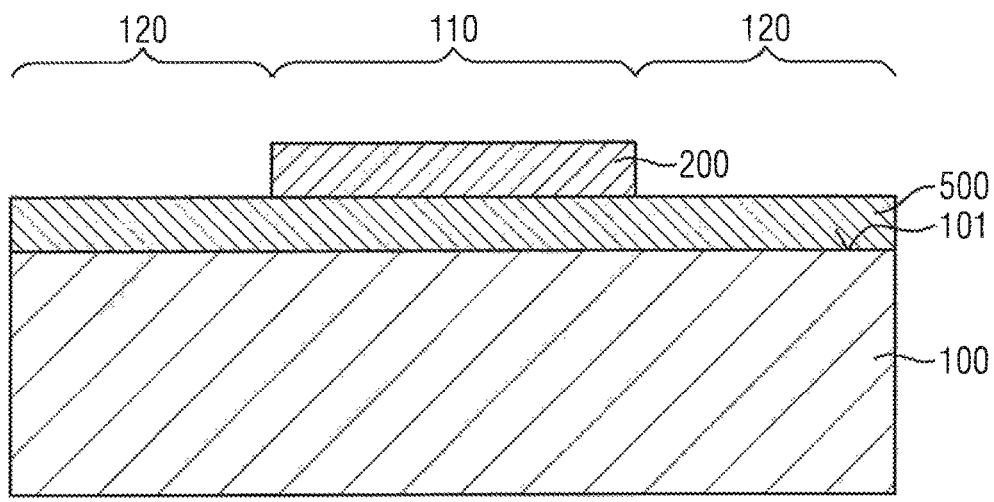
FIG. 12 schematically shows a sectional side view of a semiconductor body with an electrically conductive layer arranged above its surface, and with a sacrificial layer arranged in a first region thereabove.

FIG. 12 shows a schematic sectional side view of the semiconductor body 100 comprising the surface 101 comprising the first region 110 and the second region 120 in accordance with a further variant of the method. In the variant shown in FIG. 12, the electrically conductive layer 500 covers the surface 101 of the semiconductor body 100 both in the first region 110 and in the second region 120. The sacrificial layer 200 is arranged above the first region 110 of the surface 101 of the semiconductor body 100 on the electrically conductive layer 500 and thereby defines the first region 110.

Figure 13:
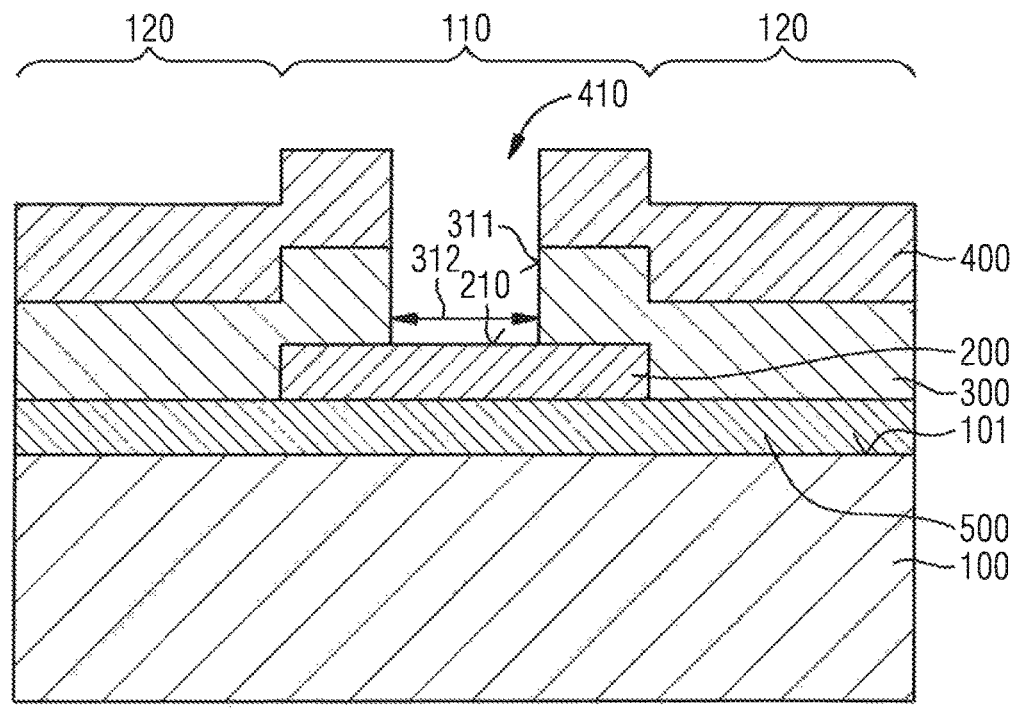
FIG. 13 schematically shows a sectional side view of the semiconductor body after the process of applying a passivation layer and a photoresist layer and the process of creating openings in the photoresist layer and the passivation layer.

FIG. 13 shows a schematic sectional side view of the semiconductor body 100 in a processing state succeeding the illustration in FIG. 12.

The passivation layer 300 and the photoresist layer 400 have been arranged above the sacrificial layer 200 and above the electrically conductive layer 500 above the second region 120 of the surface 101 of the semiconductor body 100. Afterward, the opening 410 was formed in the photoresist layer 400 and the opening 311 was formed in the passivation layer 300 above the first region 110 of the surface 101, such that the portion 210 of the sacrificial layer 200 is then exposed.

Figure 14:
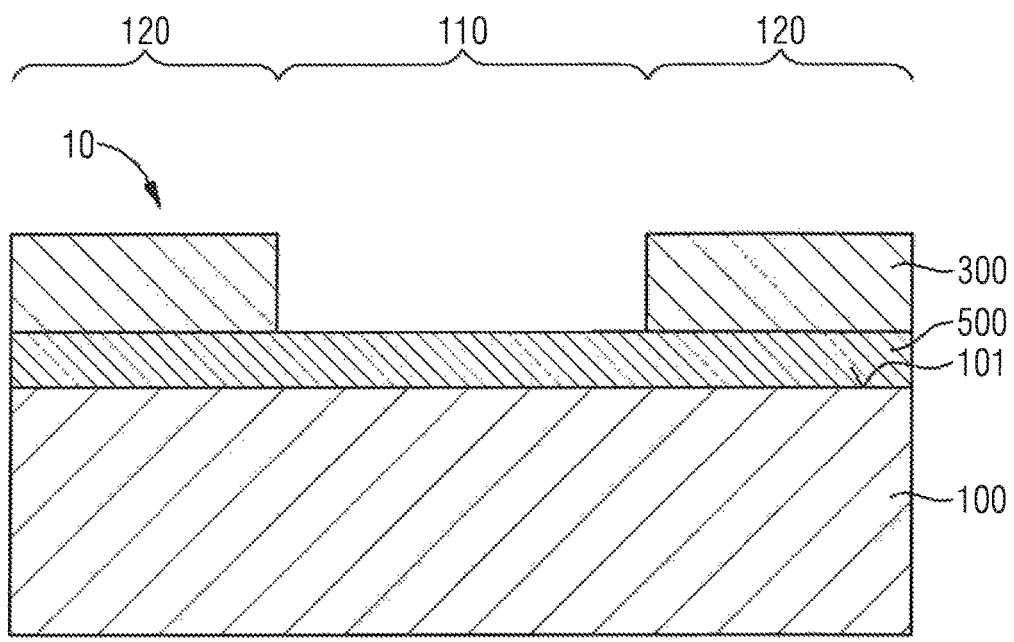
FIG. 14 shows a schematic sectional side view of an electronic component formed from the semiconductor body after the process of dissolving the sacrificial layer and the process of removing the photoresist layer.

FIG. 14 shows a schematic sectional side view of the semiconductor body 100 in a processing state temporally succeeding the illustration in FIG. 13. The electronic component 10 has been formed from the semiconductor body 100, which electronic component may still be unfinished in the processing state shown in FIG. 14.

The sacrificial layer 200 was dissolved through the opening 311 of the passivation layer 300. Moreover, the photoresist layer 400 was removed from the top side of the passivation layer 300. Furthermore, the parts of the passivation layer 300 projecting above the first region 110 of the surface 101 in a self-supporting manner after the process of dissolving the sacrificial layer were removed. As a result, in the electronic component 10, the electrically conductive layer 500 is exposed above the first region 110 of the surface 101 of the semiconductor body 100, while it is covered by the passivation layer 300 above the second region 120 of the surface 101. The access to the electrically conductive layer 500 that is formed above the first region 110 of the surface 101 may serve, for example, to electrically contact the electronic component 10.

Figure 15:
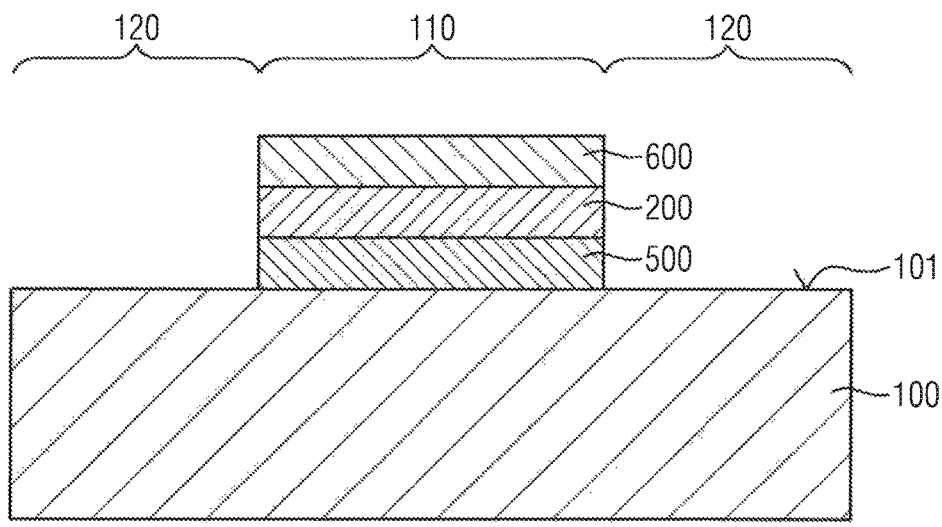
FIG. 15 shows a schematical side view of a semiconductor body with a layer stack arranged above a first region of its surface, said layer stack comprising an electrically conductive layer, a sacrificial layer and a cover layer.

FIG. 15 shows a schematic sectional side view of the semiconductor body 100 comprising the surface 101 comprising the first region 110 and the second region 120, in accordance with a further variant of the method. The electrically conductive layer 500, the sacrificial layer 200 and a cover layer 600 have been arranged successively above the first region 110 of the surface 101. The cover layer 600 completely covers the sacrificial layer 200. The sacrificial layer 200 and the cover layer 600 jointly define the first region 110 of the surface 101. In the example shown in FIG. 15, the electrically conductive layer 500 is likewise restricted to the first region 110, although that is not absolutely necessary.

The cover layer 600 comprises a material that is well etchable by the dry-chemical etching method used to create the opening 311 in the passivation layer 300. The material of the cover layer 600 may additionally also be etchable by the wet-chemical etching method used for dissolving the sacrificial layer 200, but may also be resistant relative to the etching method. The cover layer 600 may comprise, for example, a material comprising SiO, SiN, TiWN, a photoresist or a metal.

Figure 16:
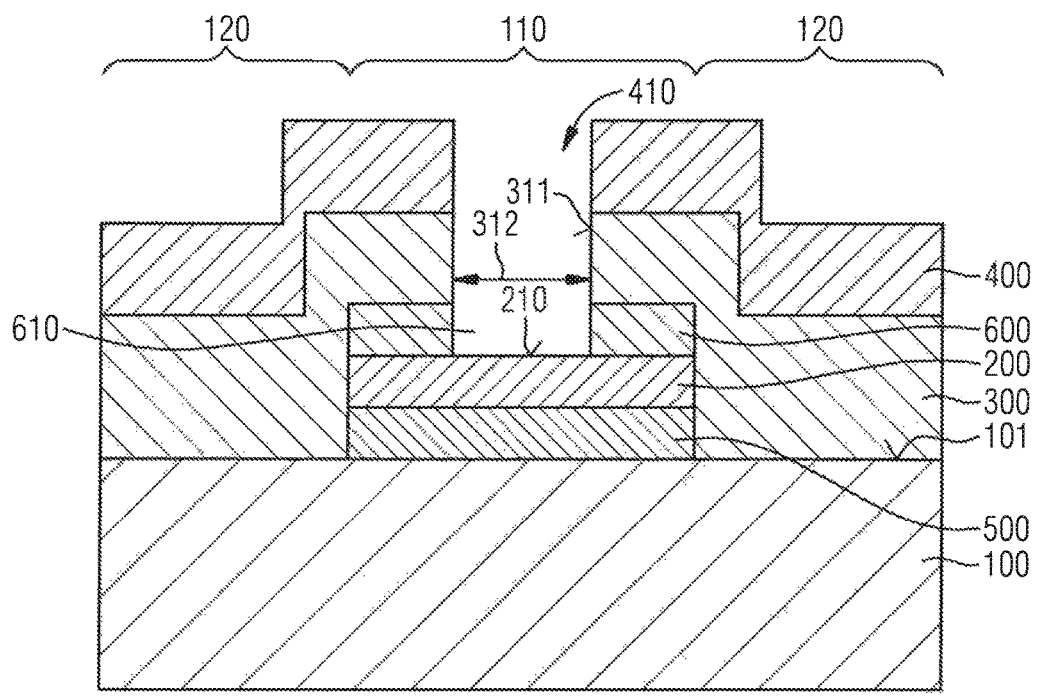
FIG. 16 schematically shows the semiconductor body after the process of applying a passivation layer and a photoresist layer and the process of creating openings in the photoresist layer and the passivation layer.

FIG. 16 shows a schematic sectional side view of the semiconductor body 100 in a processing state temporally succeeding the illustration in FIG. 15.

The passivation layer 300 and the photoresist layer 400 have been arranged above the cover layer 600 and above the second region 120 of the surface 101. Afterward, the opening 410 has been created in the photoresist layer 400 and the opening 311 has been created in the passivation layer 300. Moreover, after the process of creating the opening 311 in the passivation layer 300, an opening 610 was created in the cover layer 600, which is adjacent to the opening 311 of the passivation layer 300 in a substantially flush manner and exposes the portion 210 of the sacrificial layer 200. Creating the opening 610 in the cover layer 600 may have been carried out by the same dry-chemical etching process as for creating the opening 311 in the passivation layer 300. However, creating the opening 311 in the passivation layer 300 and creating the opening 610 in the cover layer 600 may also be carried out by different etching processes.

Figure 17:
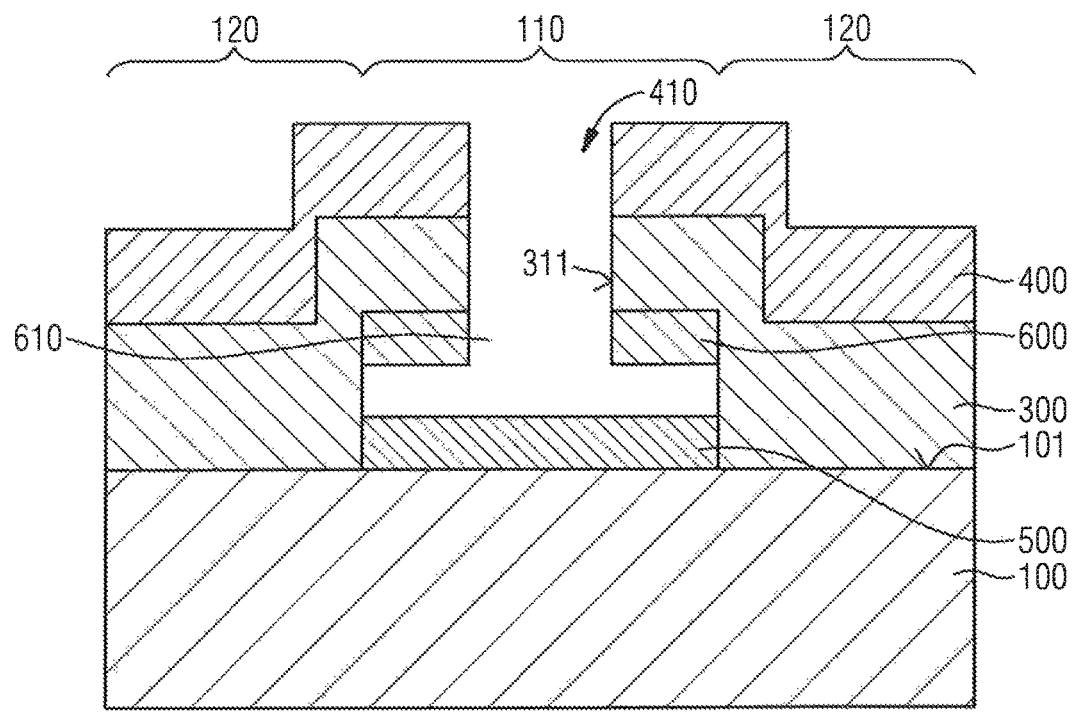
FIG. 17 schematically shows the semiconductor body after the process of dissolving the sacrificial layer.

FIG. 17 shows a schematic sectional side view of the semiconductor body 100 in a processing state temporally succeeding the illustration in FIG. 16.

The sacrificial layer 200 has been removed through the openings 410, 311, 610 in the photoresist layer 400, the passivation layer 300 and the cover layer 600. As a result, parts of the passivation layer 300 and parts of the cover layer 600 that are arranged thereon project in a self-supporting manner above the electrically conductive layer 500 arranged above the first region 110 of the surface 101.

Figure 18:
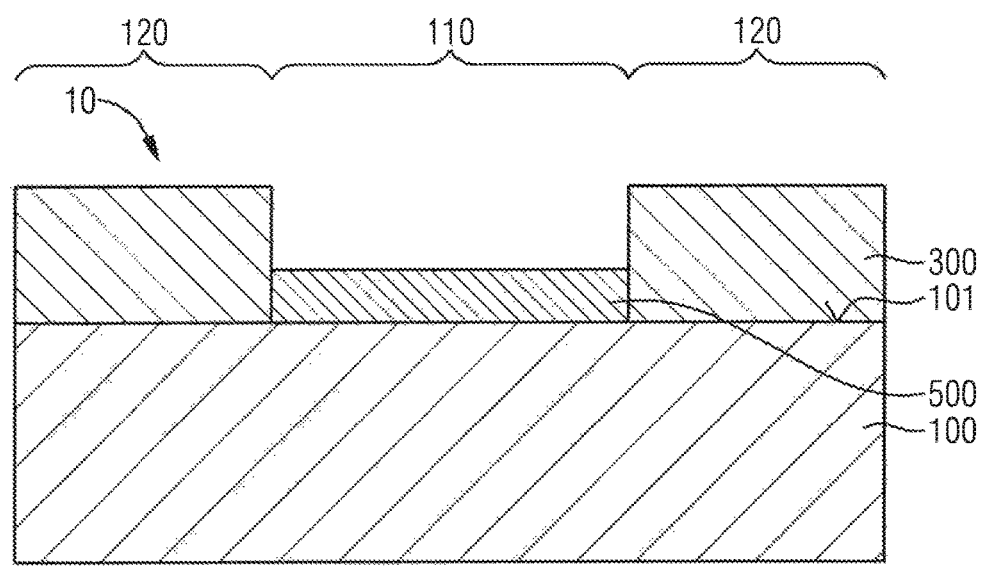
FIG. 18 schematically shows a sectional side view of an electronic component formed from the semiconductor body after the process of removing the photoresist layer.

FIG. 18 shows a schematic sectional side view of the semiconductor body 100 in a processing state temporally succeeding the illustration in FIG. 17. The electronic component 10 has been formed from the semiconductor body 100, which electronic component may still be unfinished in the processing state illustrated in FIG. 18.

The photoresist layer 400 has been removed from the top side of the passivation layer 300. In this case or during a further processing step, the self-supporting parts of the passivation layer 300 above the first region 110 and the parts of the cover layer 600 adhering thereto have been removed. As a result, the electrically conductive layer 500 in the case of the electronic component 10 is exposed above the entire first region 110 of the surface 101 of the semiconductor body 100. The passivation layer 300 is arranged above the second region 120 of the surface 101. The electrically conductive layer 500 exposed above the first region 110 of the surface 101 of the semiconductor body 100 may serve, for example, to electrically contact the electronic component 10.

Figure 19:
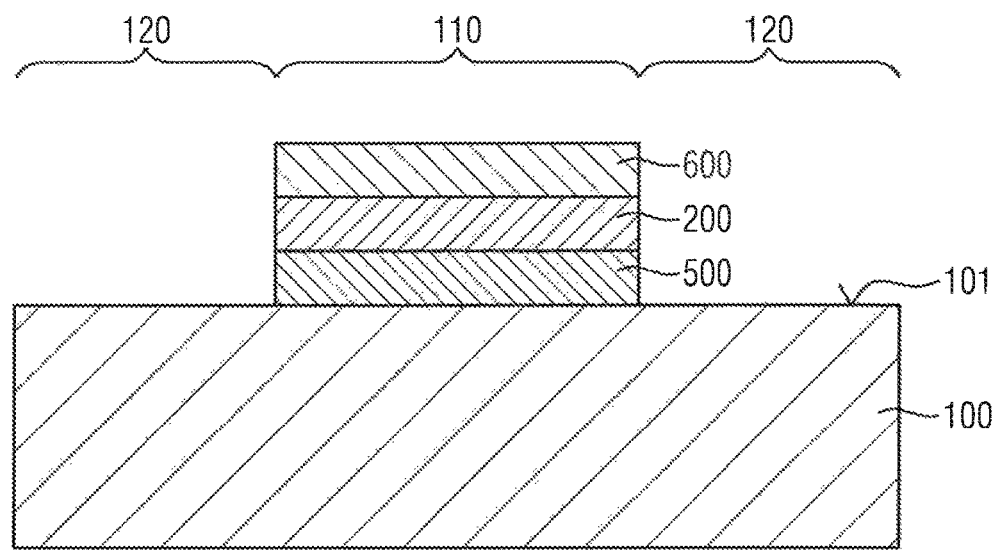
FIG. 19 schematically shows a schematical side view of a semiconductor body with a layer stack arranged above a first region of its surface, said layer stack comprising an electrically conductive layer, a sacrificial layer and a cover layer.

FIG. 19 shows a schematic sectional side view of the semiconductor body 100 comprising the surface 101 comprising the first region 110 and the second region 120, in accordance with a further variant of the method. Once again the electrically conductive layer 500, the sacrificial layer 200 and the cover layer 600 are arranged one above another above the first region 110 of the surface 101.

Figure 20:
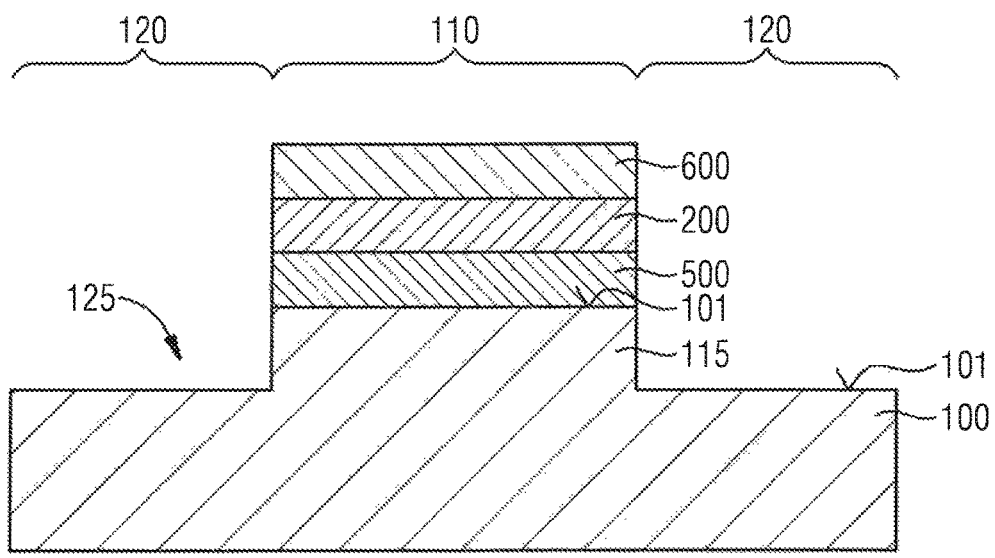
FIG. 20 schematically shows the semiconductor body after the process of removing a part of the semiconductor body in a second region.

FIG. 20 shows a schematic sectional side view of the semiconductor body 100 in a processing state temporally succeeding the illustration in FIG. 19.

A part 125 of the surface 101 of the semiconductor body 100 in the second region 120 of the surface 101 has been removed. Removing the part 125 of the surface 101 in the second region 120 may have been carried out, for example, by a dry-chemical etching method, in particular by a dry-chemical etching method using chlorine.

During the removal of the part 125 of the surface 101 in the second region 120, the cover layer 600 arranged above the first region 110 of the surface 101 acted as an etching mask and thereby prevented a removal of the material of the semiconductor body 100 in the first region 110 of the surface 101. As a result, the surface 101 of the semiconductor body 100 is now elevated in the first region 110 above the surface 101 in the second region 120. At the boundary between the first region 110 and the second region 120, the elevated part of the surface 101 comprises substantially perpendicular sidewalls.

The elevated region of the surface 101 in the first region 110 of the surface 101 may form, for example, a waveguide structure 115 of a laser component to be produced from the semiconductor body 100. In this case, the semiconductor body 100 comprises a semiconductor layer sequence in the region of the waveguide structure 115, the semiconductor layer sequence forming a laser diode.

It would also be possible to dispense with the cover layer 600. In this case, the sacrificial layer 200 may serve as an etching mask during the removal of the part 125 in the second region 120 of the surface 101.

Figure 21:
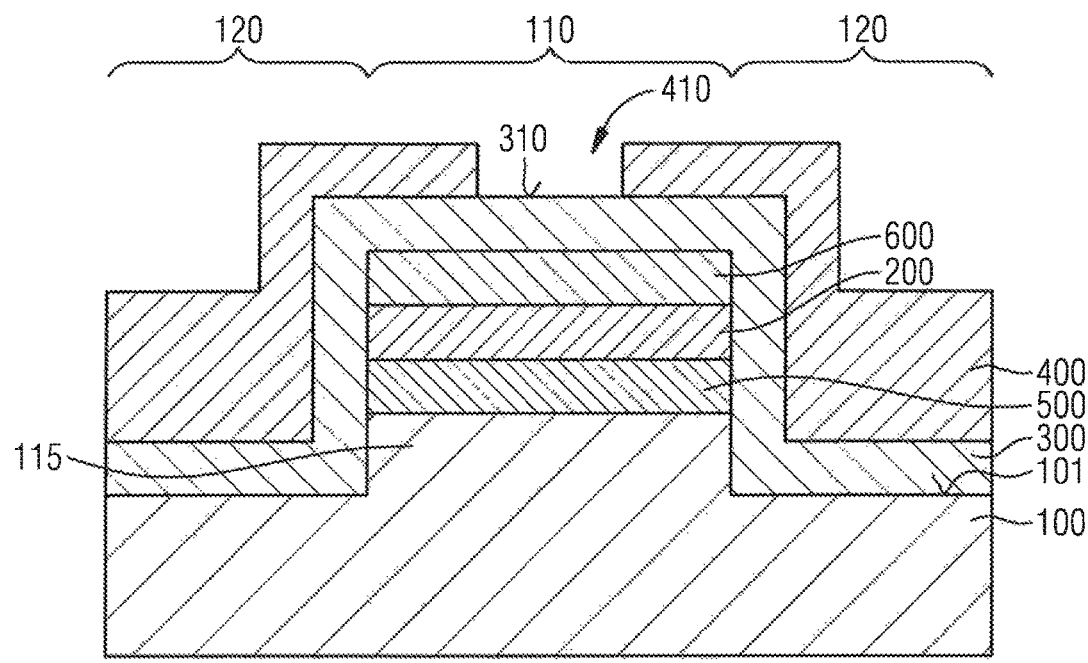
FIG. 21 schematically shows the semiconductor body after the process of applying a passivation layer and a photoresist layer and the process of creating an opening in the photoresist layer.

FIG. 21 shows a schematic sectional side view of a semiconductor body 100 in a processing state temporally succeeding the illustration in FIG. 20.

The passivation layer 300 has been arranged above the cover layer 600 and above the second region 120 of the surface 101. The passivation layer 300 also covers the perpendicular sidewalls of the waveguide structure 115 formed in the transition region between the first region 110 and the second region 120 of the surface 101 of the semiconductor body 100. The photoresist layer 400 has been arranged above the passivation layer 300. The opening 410 in the photoresist layer 400 has been created above the first region 110 of the surface 101, as a result of which the portion 310 of the passivation layer 300 has been exposed.

Figure 22:
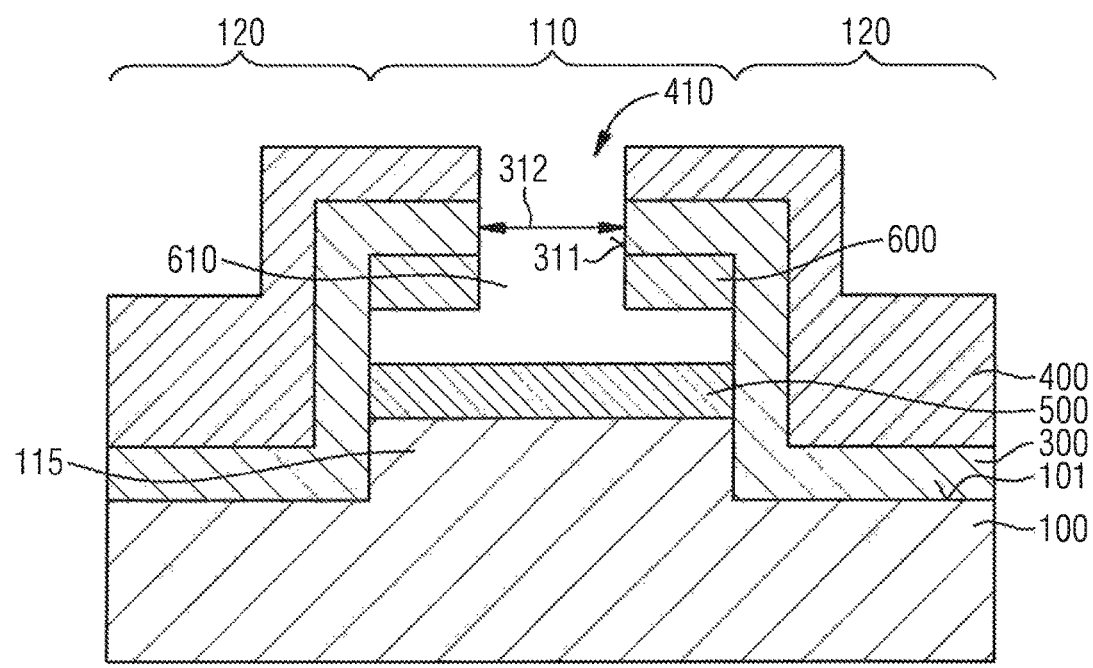
FIG. 22 schematically shows the semiconductor body after the process of creating an opening in the passivation layer and the process of dissolving the sacrificial layer.

FIG. 22 shows a schematic sectional side view of the semiconductor body 100 in a processing state temporally succeeding the illustration in FIG. 21.

The opening 311 and the opening 610 have been created in the passivation layer 300 and the cover layer 600. Afterward, the sacrificial layer 200 has been dissolved.

Figure 23:
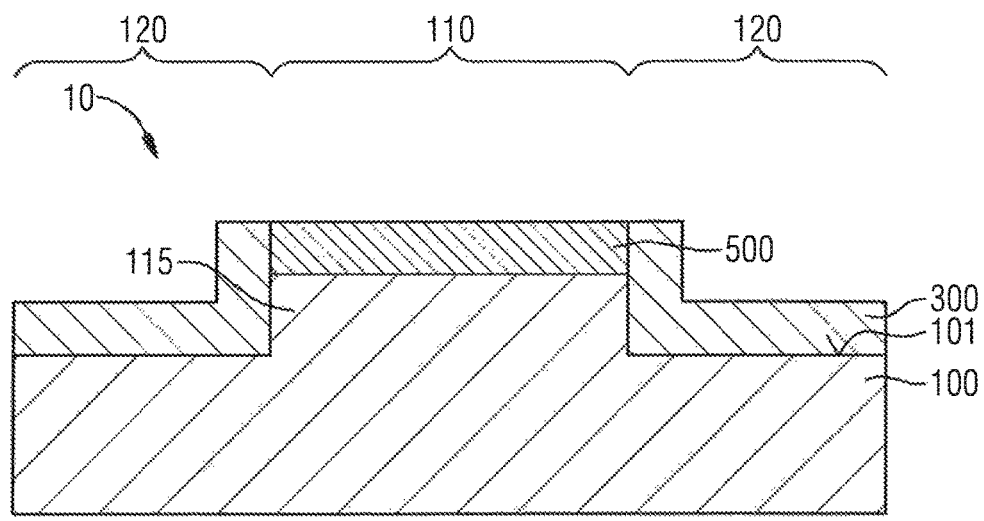
FIG. 23 schematically shows a sectional side view of an electronic component formed from the semiconductor body after the process of removing the photoresist layer.

FIG. 23 shows a schematic sectional side view of the semiconductor body 100 in a processing state temporally succeeding the illustration in FIG. 22. The electronic component 10 has been formed from the semiconductor body 100, which may still be unfinished in the illustration in FIG. 23. The electronic component 10 may be for example a laser component.

Proceeding from the processing state shown in FIG. 22, the photoresist layer 400 has been removed from the top side of the passivation layer 300. In this case or during a further processing step, the parts of the passivation layer 300 projecting above the first region 110 of the surface 101 and the parts of the cover layer 600 adhering thereto have been removed. As a result, the electrically conductive layer 500 in the electronic component 10 is then exposed above the entire waveguide structure 115 in the first region 110 of the surface 101, which enables an electrical contacting of the electronic component 10. The second region 120 of the surface 101 of the semiconductor body 100 and the sidewalls of the waveguide structure 115 formed at the boundary between the first region 110 and the second region 120 are covered by the passivation layer 300.

Figure 24:
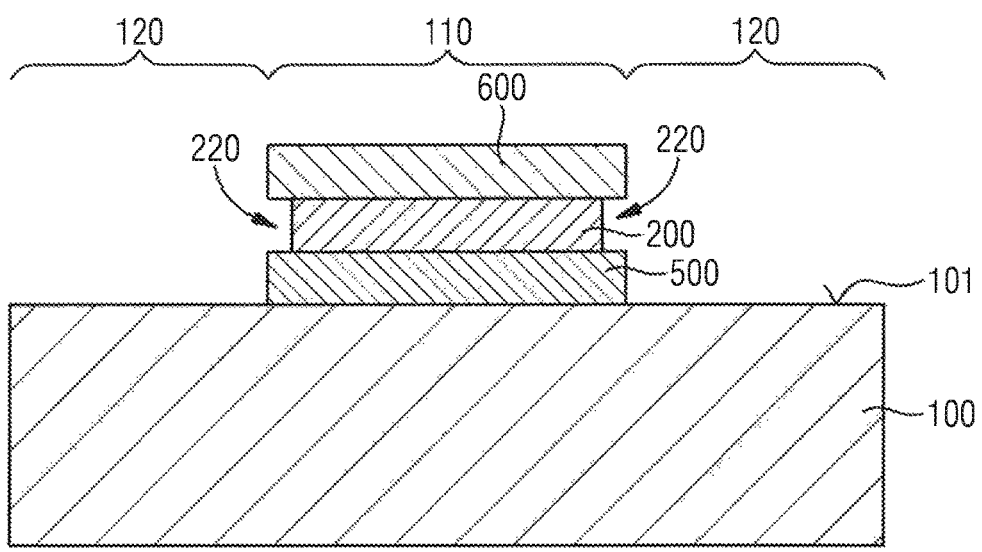
FIG. 24 schematically shows a schematical side view of a semiconductor body with a layer stack arranged above a first region of its surface, said layer stack comprising an electrically conductive layer, a sacrificial layer and a cover layer, after the process of removing a part of the sacrificial layer.

FIG. 24 shows a schematic sectional side view of the semiconductor body 100 comprising the surface 101 comprising the first region 110 and the second region 120, in accordance with a further variant of the method. The electrically conductive layer 500, the sacrificial layer 200 and the cover layer 600 have been arranged one above another above the first region 110 of the surface 101.

Afterward, a part 220 of the sacrificial layer 200 enclosed between the electrically conductive layer 500 and the cover layer 600 was dissolved laterally. The process of dissolving the part 220 may have been carried out, for example, by a wet-chemical etching method, for example, using HCl or KOH. As a result of the process of dissolving the part 220 of the sacrificial layer 200, the sacrificial layer 200 then comprises a somewhat smaller area than the electrically conductive layer 500 and the cover layer 600 in a direction parallel to the surface 101 of the semiconductor body 100.

Figure 25:
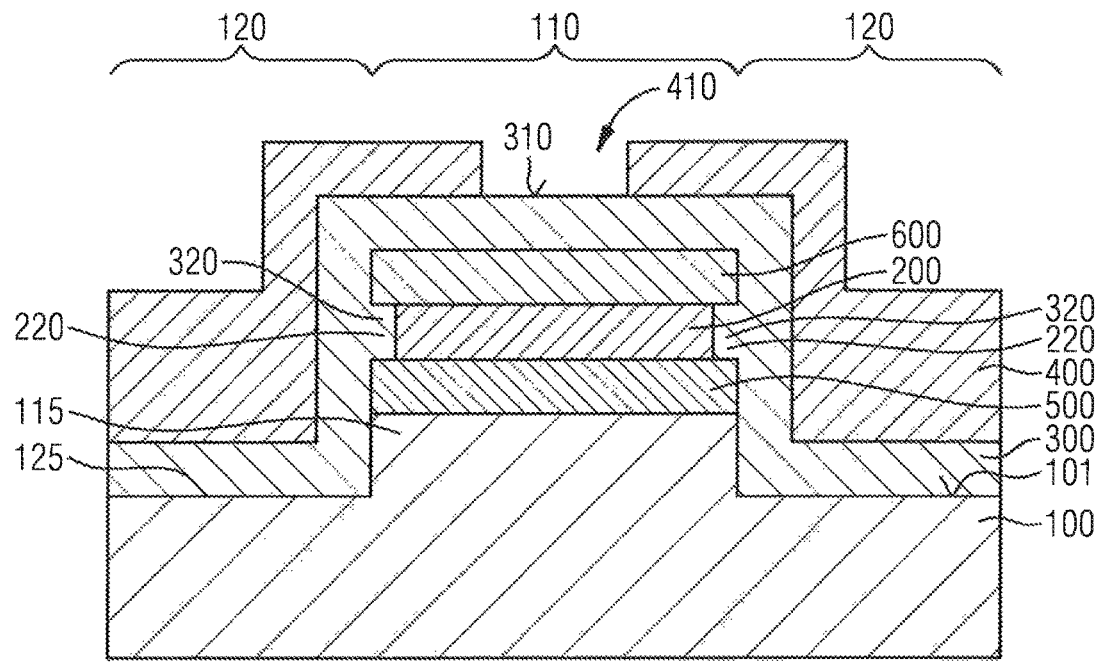
FIG. 25 schematically shows the semiconductor body after the process of applying a passivation layer and a photoresist layer and the process of creating an opening in the photoresist layer.

FIG. 25 shows a schematic sectional side view of the semiconductor body 100 in a processing state temporally succeeding the illustration in FIG. 24.

Once again, the part 125 of the surface 101 of the semiconductor body 100 was removed in the second region 120 in order to form the waveguide structure 115 in the first region 110.

Afterward, the passivation layer 300 has been arranged above the cover layer 600 and above the second region 120 of the surface 101 of the semiconductor body 100. In this case, the passivation layer 300 has also filled the free space between the electrically conductive layer 500 and the cover layer 600 that arose as a result of the process of dissolving the part 220 of the sacrificial layer 200, and forms there a collar 320 extending around the sacrificial layer 200. Afterward, the photoresist layer 400 was arranged above the passivation layer 300 and provided with the opening 410 above the first region 110 of the surface 101.

Figure 26:
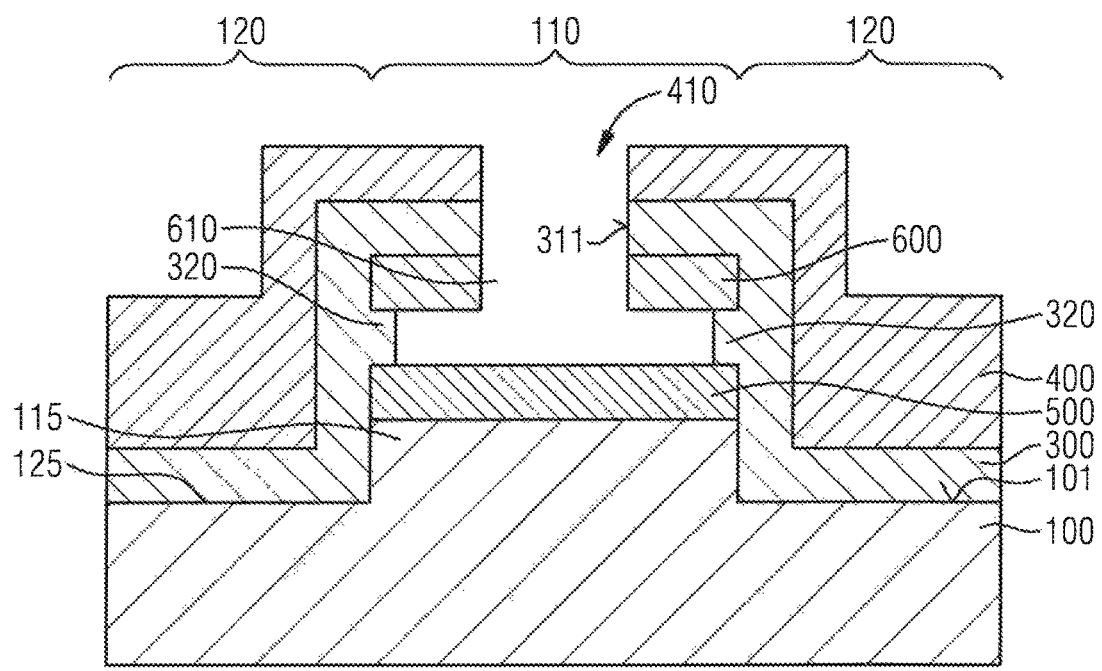
FIG. 26 schematically shows the semiconductor body after the process of creating an opening in the passivation layer and the cover layer and the process of dissolving the sacrificial layer.

FIG. 26 shows a schematic sectional side view of the semiconductor body 100 in a processing state temporally succeeding the illustration in FIG. 25.

The openings 311 and 610 have been created in the passivation layer 300 and the cover layer 600. Afterward, the sacrificial layer 200 has been dissolved.

Figure 27:
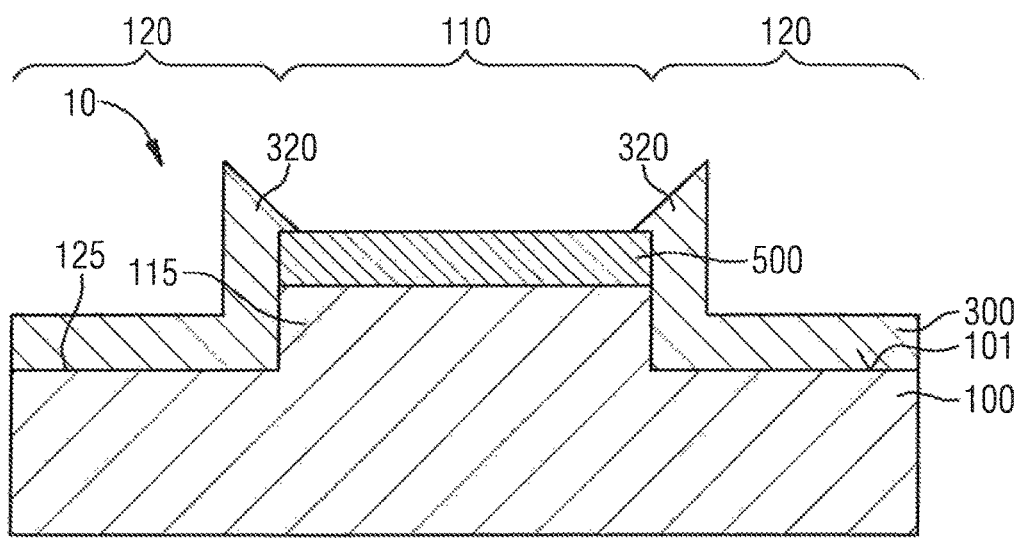
FIG. 27 schematically shows a sectional side view of an electronic component formed from the semiconductor body after the process of removing the photoresist layer.

FIG. 27 shows a schematic sectional side view of the semiconductor body 100 in a processing state temporally succeeding the illustration in FIG. 26. The electronic component 10 has been formed from the semiconductor body 100, which electronic component may still be incomplete in the processing state shown in FIG. 27. The electronic component 10 may be, for example, a laser component.

Proceeding from the processing state shown in FIG. 26, the photoresist layer 400 has been removed from the passivation layer 300. In this case or during a further processing step, the parts of the passivation layer 300 projecting above the first region 110 and the parts of the cover layer 600 adhering thereto have been separated and removed. In this case, however, the collar 320 of the passivation layer 300 arranged in the edge region of the electrically conductive layer 500 above the top side of the electrically conductive layer 500 has been partly retained. As a result, in the electronic component 10, the collar 320 of the passivation layer 300 forms a circumferential edge on the top side of the electrically conductive layer 500 above the waveguide structure 115. As a result, a particularly reliable covering of the sidewalls of the waveguide structure 115 by the passivation layer 300 is advantageously ensured in the electronic component 10.

Figure 28:
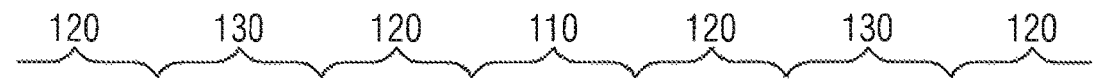
FIG. 28 schematicly shows a sectional side view of a semiconductor body in which layer stacks are respectively arranged above a first region and a third region of the surface.
Figure 28:
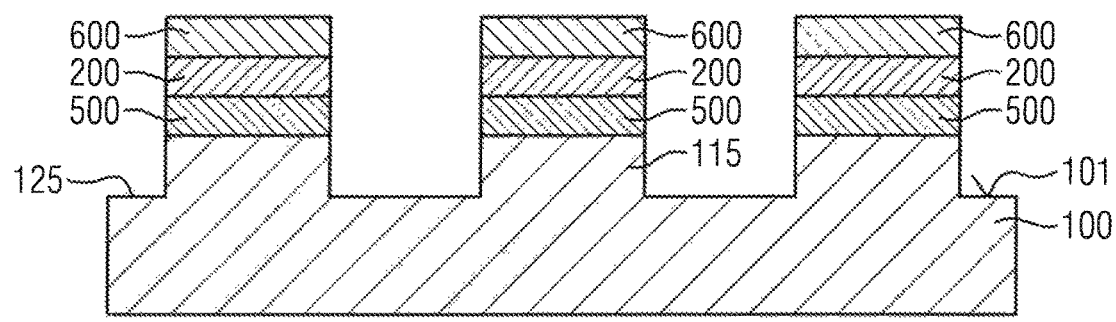

FIG. 28 shows a schematic sectional side view of the semiconductor body 100 comprising the surface 101 in accordance with a further variant of the method. In addition to the first region 110 and the second region 120 adjoining the first region 110, in the example shown in FIG. 28, the surface 101 comprises two third regions 130 arranged on both sides alongside the first region 110 and separated from the first region 110 by portions of the second region 120. The first region 110 and the third regions 130 may be configured, for example, as strips parallel to one another on the surface 101 of the semiconductor body 100.

First, the electrically conductive layer 500, the sacrificial layer 200 and the cover layer 600 were arranged successively above the first region 110 and above the third regions 130 of the surface 101 of the semiconductor body 100. The electrically conductive layer 500, the sacrificial layer 200 and the cover layer 600 thus each comprise a plurality of portions laterally spaced apart from one another, which are arranged above the first region 110 and above the third regions 130 of the surface 101 and which thereby define the positions of these regions 110, 130.

Afterward, the part 125 of the surface 101 was removed in the second region 120 of the surface 101, as a result of which the waveguide structure 115 has been formed in the first region 110. In the third regions 130, too, the surface 101 of the semiconductor body 100 is elevated above the surface 101 in the second region 120.

Figure 29:
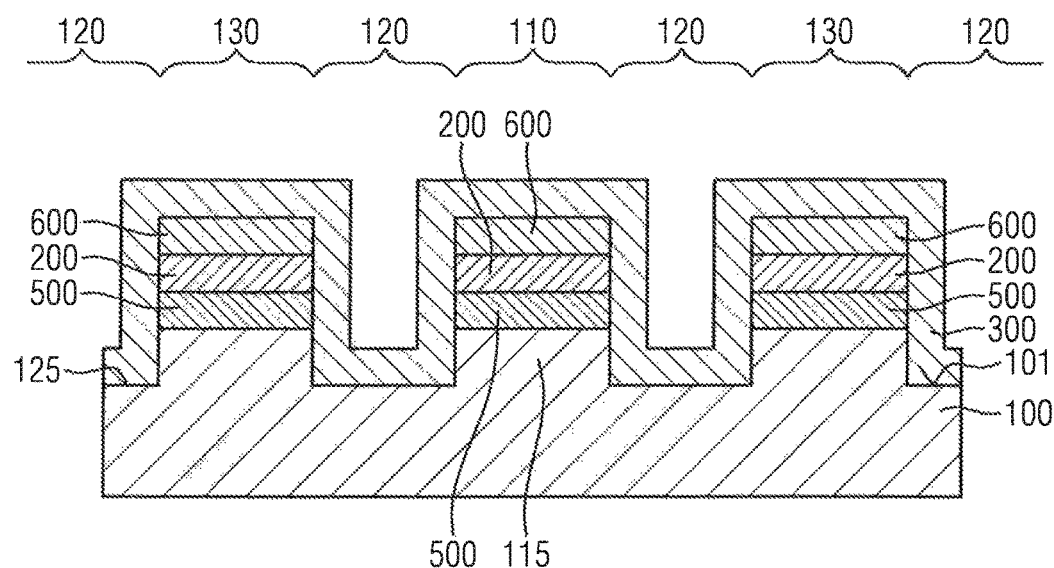
FIG. 29 schematically shows the semiconductor body after the process of applying a passivation layer.

FIG. 29 shows a schematic sectional side view of the semiconductor body 100 in a processing state temporally succeeding the illustration in FIG. 28.

The passivation layer 300 has been arranged above the cover layer 600 and above the second region 120 of the surface 101 of the semiconductor body 100. The passivation layer 300 thus extends above the first region 110, the second region 120 and the third regions 130 of the surface 101 of the semiconductor body 100.

Figure 30:
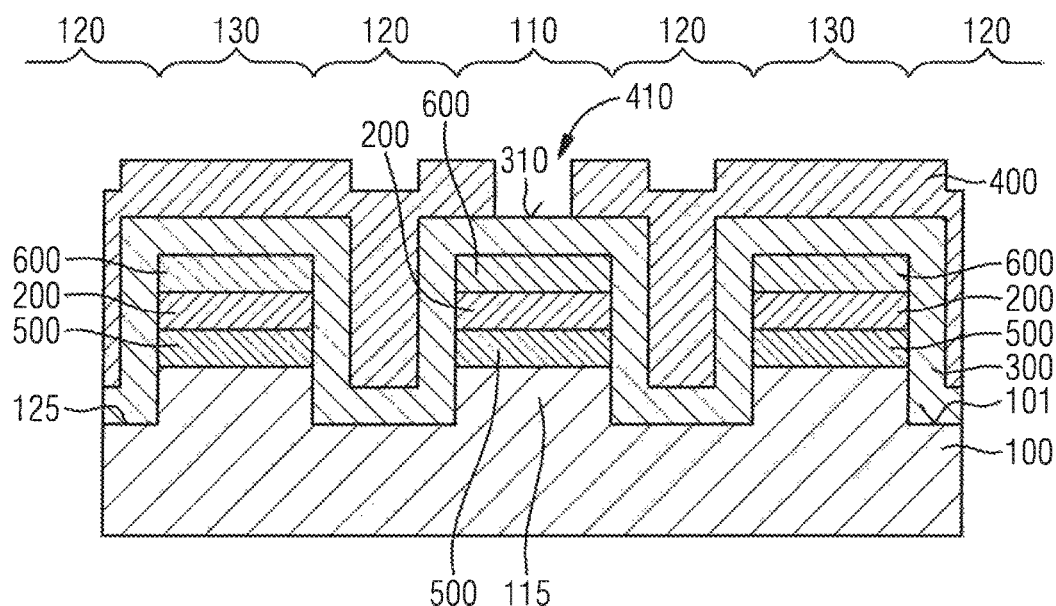
FIG. 30 schematically shows the layer stack after the process of applying a photoresist layer and the process of creating an opening in the photoresist layer above the first region of the surface of the semiconductor body.

FIG. 30 shows a schematic sectional side view of the semiconductor body 100 in a processing state temporally succeeding the illustration in FIG. 29.

The photoresist layer 400 has been arranged above the passivation layer 300. Afterward, the opening 410 in the photoresist layer 400 has been created above the first region 110 of the surface 101 of the semiconductor body 100, as a result of which the portion 310 of the passivation layer 300 has been exposed. Above the third regions 130 no openings have been created in the photoresist layer 400.

Figure 31:
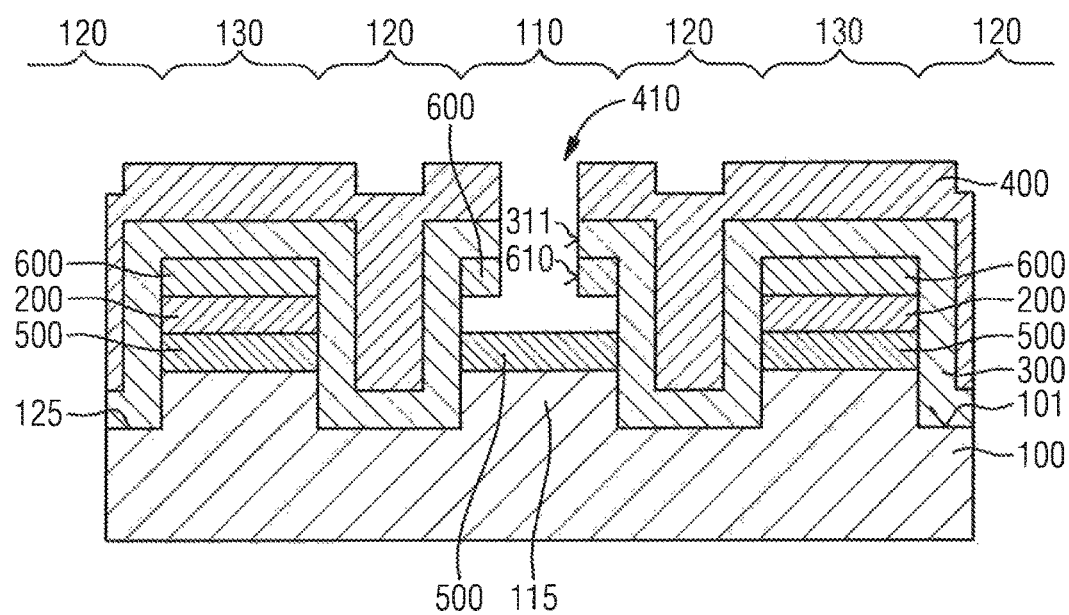
FIG. 31 schematically shows the semiconductor body after the process of creating an opening in the passivation layer and the process of dissolving a sacrificial layer above the first region of the surface of the semiconductor body.

FIG. 31 shows a schematic sectional side view of the semiconductor body 100 in a processing state temporally succeeding the illustration in FIG. 30.

The opening 311 and the opening 610 have been created in the passivation layer 300 and in the cover layer 600 above the first region 110 of the surface 101 of the semiconductor body 100. Afterward, the part of the sacrificial layer 200 arranged above the first region 110 of the surface 101 has been removed. The parts of the sacrificial layer 200 arranged above the third regions 130 of the surface 101 have remained enclosed below the unopened parts of the passivation layer 300.

Figure 32:
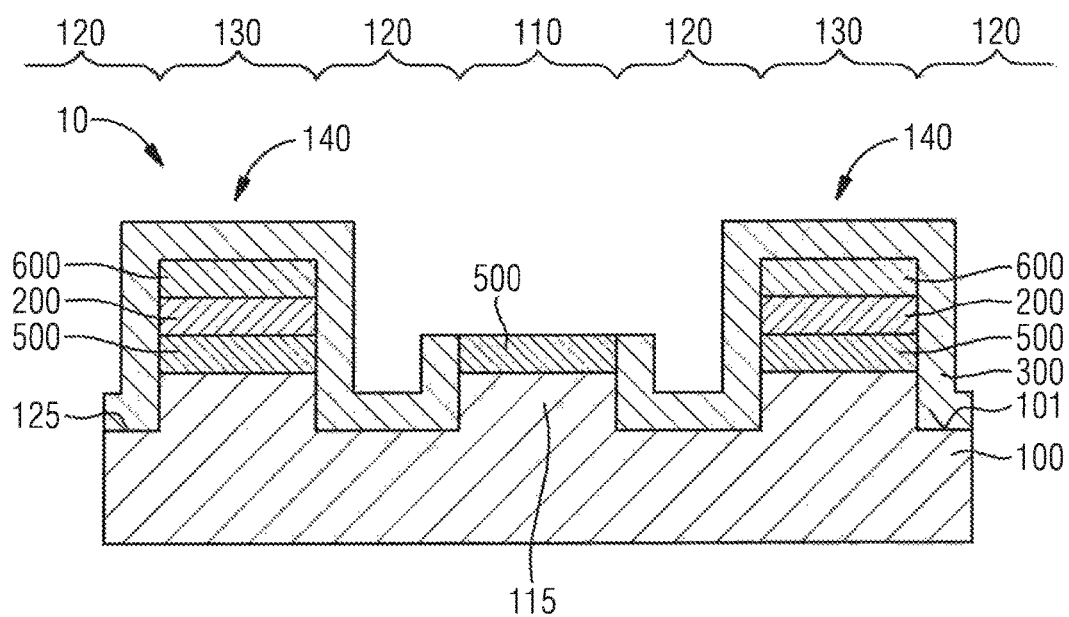
FIG. 32 schematically shows a sectional side view of an electronic component formed from the semiconductor body after the process of removing the photoresist layer.

FIG. 32 shows a schematic sectional side view of the semiconductor body 100 in a processing state temporally succeeding the illustration in FIG. 31. The electronic component 10 has been formed from the semiconductor body 100, which electronic component may still be incomplete in the processing state shown in FIG. 32. The electronic component 10 may be, for example, a laser component.

Proceeding from the processing state shown in FIG. 31, the photoresist layer 400 has been removed. In this case or during a further processing step, the parts of the passivation layer 300 arranged above the first region 110 of the surface 101 of the semiconductor body 100 and the parts of the cover layer 600 adhering thereto were separated and removed. As a result, the electrically conductive layer 500 on the top side of the waveguide structure 115 above the first region 110 of the surface 101 is then exposed.

The sidewalls of the waveguide structure 115 at the boundaries between the first region 110 and the second region 120 are covered by the passivation layer 300.

The passivation layer 300 also covers the elevated regions of the surface 101 of the semiconductor body 100 in the third regions 130 of the surface 101 with—arranged thereabove—the layer sequences of the electrically conductive layer 500, the sacrificial layer 200 and the cover layer 600. These structures enclosed by the passivation layer 300 above the third regions 130 of the surface 101 of the semiconductor body 100 form supporting structures 140 that project beyond the waveguide structure 115 in a direction perpendicular to the surface 101 of the semiconductor body 100. The supporting structures 140 may serve for example as mechanical stops for protecting the waveguide structure 115 against damage.

Our methods have been illustrated and described in greater detail on the basis of the preferred examples. Nevertheless, this disclosure is not restricted to the examples disclosed. Rather, other variations may be derived therefrom by those skilled in the art, without departing from the scope of the appended claims.

This application claims priority of DE 10 2015 102 300.8, the subject matter of which is incorporated herein by reference.

The invention claimed is:

1. A method of producing an electronic component comprising:
   providing a surface comprising a first region and a second region adjoining the first region;
   arranging a sacrificial layer above the first region of the surface, but not above the second region of the surface;
   arranging a passivation layer above the sacrificial layer and the second region of the surface;
   creating an opening in the passivation layer above of the surface and within the first region, wherein the opening in the passivation layer is created with an opening area that is smaller than the first region; and
   removing the sacrificial layer and the portions of the passivation layer that are arranged above the first region.

2. The method according to claim 1, wherein creating the opening in the passivation layer comprises:
   arranging a photoresist layer above the passivation layer;
   creating an opening in the photoresist layer above the first region of the surface;
   removing a part of the passivation layer that is arranged below the opening in the photoresist layer; and
   removing the photoresist.

3. The method according to claim 1, wherein, before arranging the sacrificial layer, an electrically conductive layer is arranged above the first region of the surface or above the first region and the second region of the surface.

4. The method according to claim 1, wherein, before arranging the passivation layer, a part of the surface is removed in the second region.

5. The method according to claim 1, wherein the surface is a surface of a semiconductor body.

6. The method according to claim 4, wherein the electronic component is a laser component and a waveguide structure of the laser component is formed in the first region of the surface.

7. The method according to claim 1, wherein, before arranging the passivation layer, a cover layer is arranged above the sacrificial layer, and after creating the opening in the passivation layer, a part of the cover layer arranged below the opening in the passivation layer is also removed.

8. The method according to claim 7, wherein, before arranging the passivation layer, a part of the sacrificial layer is removed.

9. The method according to claim 7, wherein the cover layer is created from a material comprising SiO, SiN, TiWN, a photoresist or a metal.

10. The method according to claim 1, wherein the sacrificial layer is also arranged above a third region of the surface, said third region being spaced apart from the first region, the passivation layer is also arranged above the third region of the surface, and above the third region of the surface, no opening is created in the passivation layer.

11. The method according to claim 1, wherein the sacrificial layer is created from a material comprising ZnO, $Al_2O_3$, TiWN, SiO or a photoresist.

12. The method according to claim 1, wherein the sacrificial layer is created with a thickness of 10 nm to 1 µm.

13. The method according to claim 1, wherein the passivation layer is created by chemical vapor deposition or atomic layer deposition.

14. The method according to claim 1, wherein the passivation layer is created from a material comprising SiN, SiO, TaO, ZrO, AlO or ITO.

15. The method according to claim 1, wherein the passivation layer is created with a thickness of 1 nm to 1 µm.

16. The method according to claim 2, wherein removing part of the passivation layer is carried out by dry-chemical etching using fluorine, chlorine or argon.

17. The method according to claim 1, wherein removing the sacrificial layer is carried out by wet-chemical etching using HCl or KOH.

* * * * *